(12) United States Patent
Kim et al.

(10) Patent No.: US 12,052,903 B2
(45) Date of Patent: Jul. 30, 2024

(54) ELECTRONIC DEVICE AND METHOD OF MANUFACTURING THE SAME

(71) Applicant: Samsung Display Co., Ltd., Yongin-si (KR)

(72) Inventors: Jong-Tae Kim, Seoul (KR); Hee-Kwon Eun, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 240 days.

(21) Appl. No.: 17/490,875

(22) Filed: Sep. 30, 2021

(65) Prior Publication Data

US 2022/0123072 A1    Apr. 21, 2022

(30) Foreign Application Priority Data

Oct. 15, 2020    (KR) .......................... 10-2020-0133525

(51) Int. Cl.
| | |
|---|---|
| *H01L 27/32* | (2006.01) |
| *H01L 51/52* | (2006.01) |
| *H01L 51/56* | (2006.01) |
| *H05K 1/18* | (2006.01) |
| *H05K 3/30* | (2006.01) |
| *H05K 3/32* | (2006.01) |
| *H10K 50/84* | (2023.01) |
| *H10K 59/35* | (2023.01) |

(Continued)

(52) U.S. Cl.
CPC ............. *H10K 59/65* (2023.02); *H05K 1/183* (2013.01); *H05K 1/184* (2013.01); *H05K 1/189* (2013.01); *H05K 3/305* (2013.01); *H05K 3/321* (2013.01); *H10K 50/84* (2023.02); *H10K 59/353* (2023.02); *H10K 71/00* (2023.02); *H05K 2201/09036* (2013.01); *H05K 2201/09063* (2013.01); *H05K 2201/09072* (2013.01)

(58) Field of Classification Search
CPC ......... H05K 1/183; H05K 1/184; H10K 59/65
See application file for complete search history.

(56) References Cited

U.S. PATENT DOCUMENTS

| | | |
|---|---|---|
| 10,657,904 B2 | 5/2020 | Heo et al. |
| 10,824,840 B2 | 11/2020 | Song et al. |

(Continued)

FOREIGN PATENT DOCUMENTS

| | | |
|---|---|---|
| KR | 10-2001-0046844 | 6/2001 |
| KR | 10-2006-0132094 | 12/2006 |

(Continued)

*Primary Examiner* — Victoria K. Hall
(74) *Attorney, Agent, or Firm* — CANTOR COLBURN LLP

(57) ABSTRACT

An electronic device according to an embodiment of the inventive concept includes a display panel in which a first display area and a second display area having a higher transmittance than the first display area are defined, an electronic module disposed below the second display area of the display panel, a circuit board which is connected to the display panel and on which the electronic module is mounted, and an intermediate layer disposed between the electronic module and the display panel, and the electronic module and the circuit board do not overlap each other when viewed in a plane, so that the electronic device may be made thinner, and performance of the electronic module included in the electronic device may be improved.

13 Claims, 17 Drawing Sheets

(51) Int. Cl.
 *H10K 59/65* (2023.01)
 *H10K 71/00* (2023.01)

(56) References Cited

U.S. PATENT DOCUMENTS

| | | |
|---|---|---|
| 2019/0212788 A1 | 7/2019 | Kwak et al. |
| 2019/0326367 A1 | 10/2019 | Jung et al. |
| 2020/0045826 A1* | 2/2020 | Wang .................... G06F 1/1684 |
| 2020/0160020 A1 | 5/2020 | Cho et al. |
| 2020/0174295 A1 | 6/2020 | Baek et al. |
| 2020/0194516 A1* | 6/2020 | Kim .................... H10K 77/111 |
| 2020/0280807 A1 | 9/2020 | Kim |
| 2021/0134242 A1* | 5/2021 | Hei ......................... G09G 5/02 |

FOREIGN PATENT DOCUMENTS

| | | |
|---|---|---|
| KR | 100979544 | 9/2010 |
| KR | 10-2018-0085423 | 7/2018 |
| KR | 10-2019-0084397 | 7/2019 |
| KR | 10-2019-0123830 | 11/2019 |
| KR | 10-2020-0057868 | 5/2020 |
| KR | 10-2020-0065187 | 6/2020 |
| KR | 102125480 | 6/2020 |

* cited by examiner

ELECTRONIC DEVICE AND METHOD OF MANUFACTURING THE SAME

CROSS-REFERENCE TO RELATED APPLICATION

This application claims priority from the benefit of Korean Patent Application No. 10-2020-0133525, filed on Oct. 15, 2020, which is hereby incorporated by reference for all purposes as if fully set forth herein.

BACKGROUND

Field

Embodiments of the invention relate generally to an electronic device that may be thinned and has improved performance of a sensor, a camera, and the like and a method of manufacturing the same.

Discussion of the Background

An electronic device may be a device constituted of various electronic parts such as a display panel and an electronic module. The electronic module may include a camera, an infrared sensor, a proximity sensor, or the like. The electronic module may be disposed below the display panel. Transmittance of a partial area of the display panel may be higher than that of another partial area of the display panel. The electronic module may receive an external input or provide an output through the partial area of the display panel.

The above information disclosed in this Background section is only for understanding of the background of the inventive concepts, and, therefore, it may contain information that does not constitute prior art.

SUMMARY

The present disclosure provides an electronic device that may be thinned and has improved performance of a module such as a sensor and a camera.

In addition, the present disclosure provides a method of manufacturing an electronic device for which a manufacturing process is simplified and thus the cost and time of the process are reduced.

Additional features of the inventive concepts will be set forth in the description which follows, and in part will be apparent from the description, or may be learned by practice of the inventive concepts.

An embodiment of the inventive concept provides an electronic device including a display panel in which a first display area and a second display area having a higher transmittance than the first display area are defined; an electronic module disposed below the second display area of the display panel; a circuit board which is connected to the display panel and on which the electronic module is mounted; and an intermediate layer disposed between the electronic module and the display panel, wherein the electronic module and the circuit board do not overlap each other when viewed in a plane.

In an embodiment, the electronic module may be electrically connected to the circuit board.

In an embodiment, the electronic device may further include a connector defined on the circuit board and a module circuit board configured to connect the connector and the electronic module.

In an embodiment, the intermediate layer may be an adhesive layer that attaches the electronic module to the display panel, wherein the intermediate layer includes an optically clear resin (OCR) or an optically clear adhesive (OCA).

In an embodiment, the electronic device may further include a filler layer coming in contact with at least a portion among a side surface of the intermediate layer and a side surface of the electronic module.

In an embodiment, the intermediate layer may include a metal.

In an embodiment, the intermediate layer may include an anisotropic conductive film (ACF) including conductive particles.

In an embodiment, a board opening may be defined in the circuit board, and the electronic module may be disposed in the board opening.

In an embodiment, the electronic module may come in contact with a bottom surface of the intermediate layer, and the intermediate layer may come in contact with a bottom surface of the display panel.

In an embodiment, the electronic device may further include a cover layer disposed on a lower portion of the display panel. A cover opening overlapping the electronic module may be defined in the cover layer.

In an embodiment, the display panel may include a plurality of pixels arranged in the first display area and the second display area. The plurality of pixels may include a plurality of first pixels arranged in the first display area; and a plurality of second pixels arranged in the second display area, wherein the number of the plurality of first pixels arranged per unit surface area is larger than the number of the plurality of second pixels arranged per the unit surface area.

In an embodiment, the display panel may include a first non-bendable portion in which the first display area and the second display area are defined, a bendable portion which extends from the first non-bendable portion and is bent to have a predetermined curvature, and a second non-bendable portion extending from the bendable portion and facing the first non-bendable portion, wherein the circuit board is connected to the second non-bendable portion.

In an embodiment of the inventive concept, an electronic device includes a display panel in which a first display area and a second display area having a higher transmittance than the first display area are defined; an electronic module disposed below the second display area of the display panel; a circuit board connected to the display panel and electrically connected to the electronic module; and an intermediate layer disposed between the electronic module and the display panel, wherein a board opening is defined in the circuit board, and the electronic module is disposed in the board opening, and the intermediate layer comes in contact with a bottom surface of the display panel.

In an embodiment, a mounting part on which the electronic module is mounted may be defined in the circuit board, and a board opening in which the electronic module is positioned may be defined in the mounting part.

In an embodiment of the inventive concept, a method of manufacturing an electronic device includes preparing a display panel in which a first display area and a second display area having a higher transmittance than the first display area are defined; preparing a circuit board on which an electronic module is mounted; connecting one end of the circuit board to the display panel; and bonding the electronic module to a lower portion of the display panel by bending the display panel, wherein the electronic module is disposed to overlap the second display area in the bonding of the electronic module to the lower portion of the display panel.

In an embodiment, in the bonding of the electronic module to the lower portion of the display panel, an adhesive material layer may be interposed between the electronic module and the display panel, wherein the adhesive material layer includes an optically clear resin (OCR) or an optically clear adhesive (OCA).

In an embodiment, in the bonding of the electronic module to the lower portion of the display panel, a conductive adhesive material layer may be interposed between the electronic module and the display panel, wherein the conductive adhesive material layer includes conductive particles.

In an embodiment, in the bonding of the electronic module to the lower portion of the display panel, solder may be interposed between the electronic module and the display panel, wherein the electronic module and the display panel are bonded together through a soldering process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings.

DETAILED DESCRIPTION

Figure 1A:
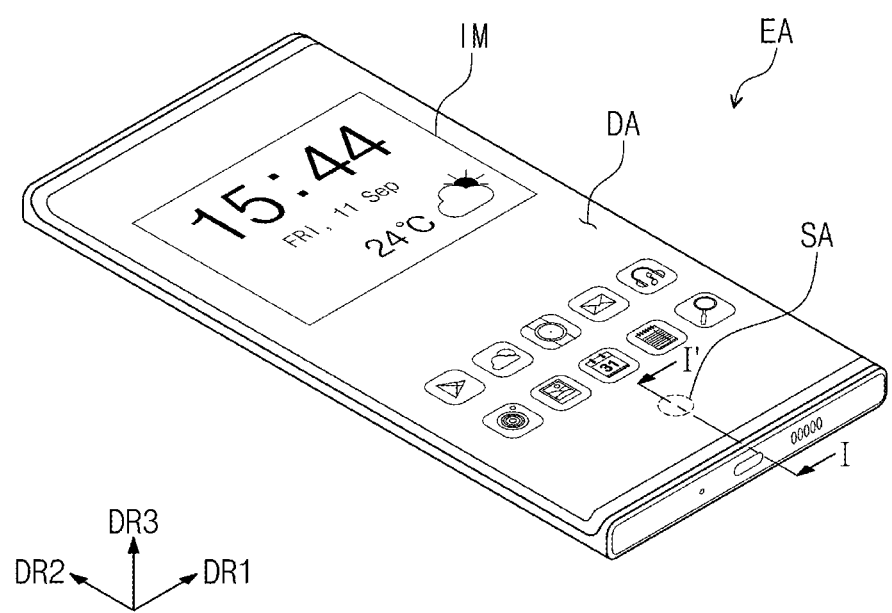
FIG. 1A is a perspective view illustrating an electronic device according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
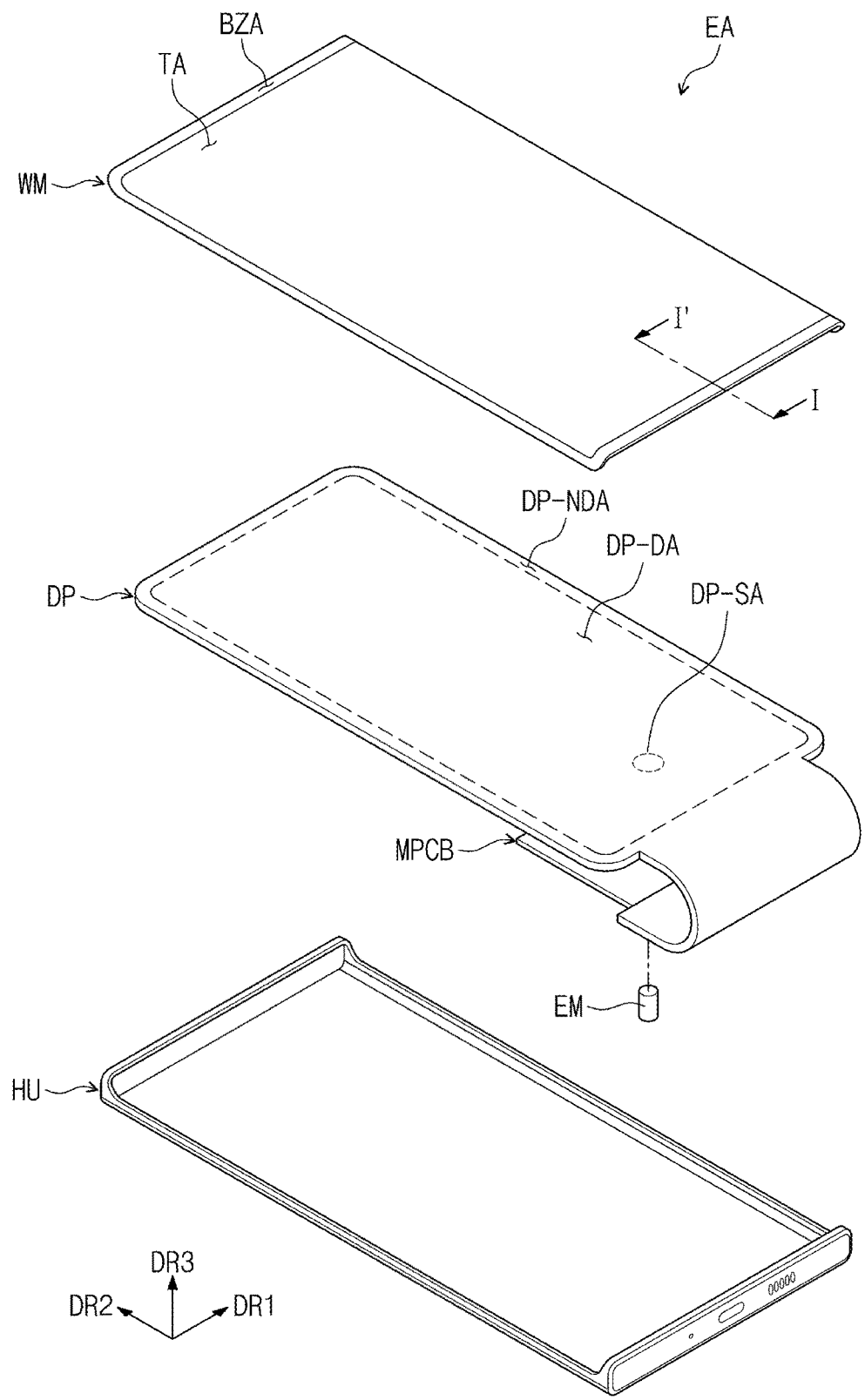
FIG. 1B is an exploded perspective view illustrating an electronic device according to an embodiment of the inventive concept.

FIG. 1A is a perspective view illustrating an electronic device according to an embodiment of the inventive concept. FIG. 1B is an exploded perspective view illustrating an electronic device according to an embodiment of the inventive concept.

Referring to FIG. 1A and FIG. 1B, an electronic device EA may be a device that is activated according to an electrical signal. For example, the electronic device EA may be a mobile phone, a tablet, a car navigation device, a game machine, or a wearable device, but the electronic device EA is not limited thereto. FIG. 1A and FIG. 1B exemplarily illustrate the electronic device EA as a mobile phone.

The electronic device EA may display an image IM through a display area DA. The display area DA may include a plane defined along a first direction DR1 and a second direction DR2. The display area DA may further include curved surfaces respectively bent from at least two sides of the plane. However, the shape of the display area DA is not limited thereto. For example, the display area DA may include only the plane or may further include four curved surfaces respectively bent from at least two sides, for example, four sides of the plane.

A sensing area SA may be included in the display area DA of the electronic device EA. Although FIG. 1A exemplarily illustrates one sensing area SA, the number of sensing areas SA is not limited thereto. In addition, a position of the sensing area SA is not limited to the position illustrated in FIG. 1A but may be freely selected within the display area DA according to a desire of the designer. For example, the sensing area SA may be positioned at one end of the display area DA, and thus a portion of an edge defining the sensing area SA may not be surrounded by the display area DA. The sensing area SA may be a portion of the display area DA. Accordingly, the electronic device EA may display an image through the sensing area SA.

An electronic module, for example, a camera module or a proximity illuminance sensor may be disposed in an area overlapping the sensing area SA. The electronic module may receive an external input transmitted through the sensing area SA or provide an output through the sensing area SA.

A thickness direction of the electronic device EA may be parallel to a third direction DR3 crossing the first direction DR1 and the second direction DR2. Accordingly, a front surface (or a top surface) and a rear surface (or a bottom surface) of each of members constituting the electronic device EA may be defined on the basis of the third direction DR3.

Referring to FIG. 1B, the electronic device EA according to an embodiment may include a window WM, a display panel DP, a circuit board MPCB, and an electronic module EM. The window WM may be disposed on the display panel DP, and the circuit board MPCB and the electronic module EM may be disposed below the display panel DP.

The display panel DP according to an embodiment may generate an image and provide the image to a user. The display panel DP according to an embodiment of the inventive concept may be a light emitting display panel and is not particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include quantum dots, quantum rods, and the like. Hereinafter, the display panel DP is described as an organic light emitting display panel.

The display panel DP may include a display area DP-DA in which an image IM (see FIG. 1A) is displayed and a peripheral area DP-NDA adjacent to the display area DP-DA. The peripheral area DP-NDA may refer non-display area. The display panel DP may include a plurality of pixels in an area corresponding to the display area DP-DA. A driving circuit, a driving line, a signal line providing an electrical signal, and the like may be disposed in an area corresponding to the peripheral area DP-NDA of the display panel DP.

The window WM may be disposed on the display panel DP. The window WM may protect the display panel DP from external impact or scratches. The window WM may cover a front surface of the display panel DP.

The window WM may include a top surface exposed to the outside. A top surface of the electronic device EA may be defined by the top surface of the window WM. The top surface of the window WM may include a transmissive area TA and a bezel area BZA adjacent to the transmissive area TA.

The transmissive area TA of the window WM may be an optically transparent area. The transmissive area TA may have a shape corresponding to the display area DP-DA of the display panel DP. For example, the transmissive area TA may overlap the entirety of or at least a portion of the display area DP-DA. An image displayed in the display area DP-DA of the display panel DP may be viewed from the outside through the transmissive area TA.

The bezel area BZA of the window WM may be adjacent to the transmissive area TA and may outline a shape of the transmissive area TA. For example, the bezel area BZA may surround the transmissive area TA. The bezel area BZA is not limited thereto, but may be disposed adjacent to only one side of the transmissive area TA or omitted. The bezel area BZA may cover the peripheral area DP-NDA of the display panel DP to block the peripheral area DP-NDA from being viewed from the outside.

The window WM may include an optically transparent insulating material. For example, the window WM may include a polymer film, a plastic substrate, a thin glass, or the like. The window WM may have a single-layer structure or a multilayer structure. Various functional layers such as an anti-reflection layer, an anti-fingerprint layer, and a phase control layer may be further disposed on the window WM.

In the electronic device EA according to an embodiment, the electronic module EM may be an electronic part that outputs or receives an optical signal. For example, the electronic module EM may be a camera module photographing an external image or a sensor module such as a proximity sensor and an infrared light emitting sensor.

The electronic module EM may overlap the sensing area SA when viewed in a plane. A separate hole corresponding to the sensing area SA may not be formed in the display panel DP, and thus an image may be provided to the outside through the sensing area SA.

The circuit board MPCB may be a component that transmits a control signal to control an operation of the display panel DP. The circuit board MPCB may be electrically bonded to the display panel DP and may be disposed on a rear surface of the display panel DP when the display panel DP is bent. The circuit board MPCB may be disposed at one end of a base layer of the display panel DP and may be electrically connected to a circuit layer of the display panel DP.

The electronic module EM and the circuit board MPCB are non-overlapping when viewed in a plane. A mounting part on which the electronic module EM is mounted may be included in the circuit board MPCB, and thus the circuit board MPCB and the electronic module EM may be non-overlapping when viewed in a plane. A detailed description thereof is given herein.

The electronic device EA may further include a housing HU configured to accommodate the display panel DP, the circuit board MPCB, and the electronic module EM. The housing HU may be combined with the window WM to form the appearance of the electronic device EA.

Figure 2A:
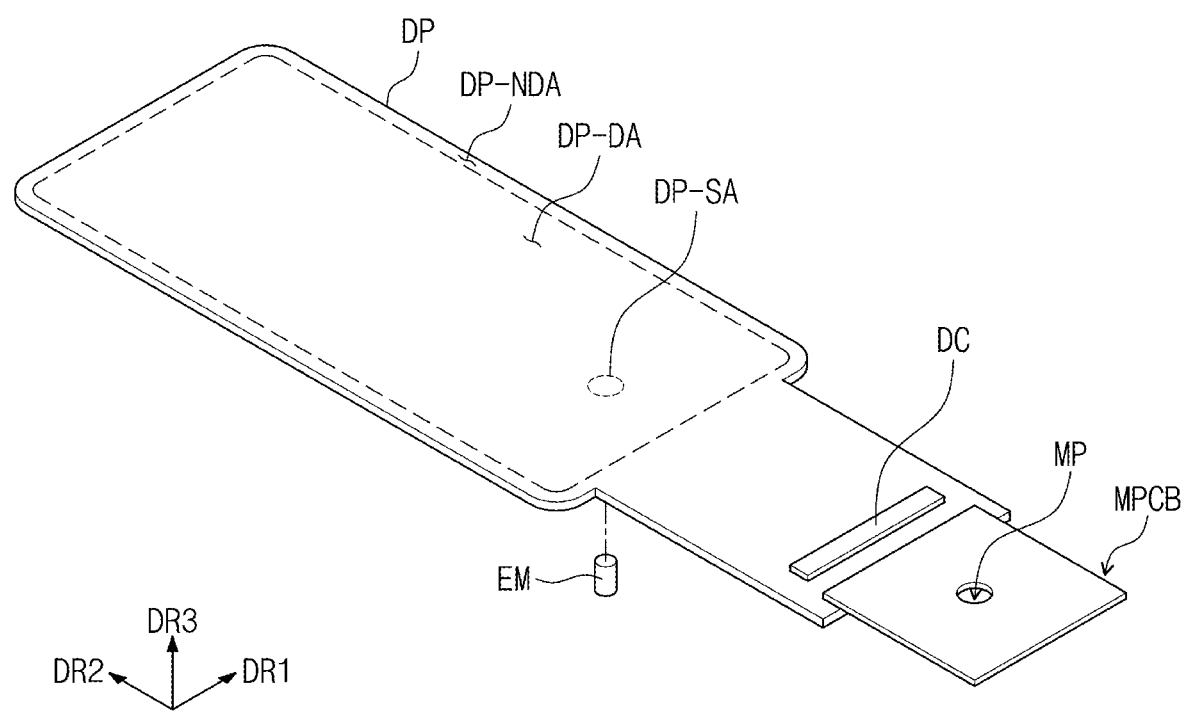
FIG. 2A is an exploded perspective view illustrating some components of an electronic device according to an embodiment of the inventive concept.
Figure 2B:
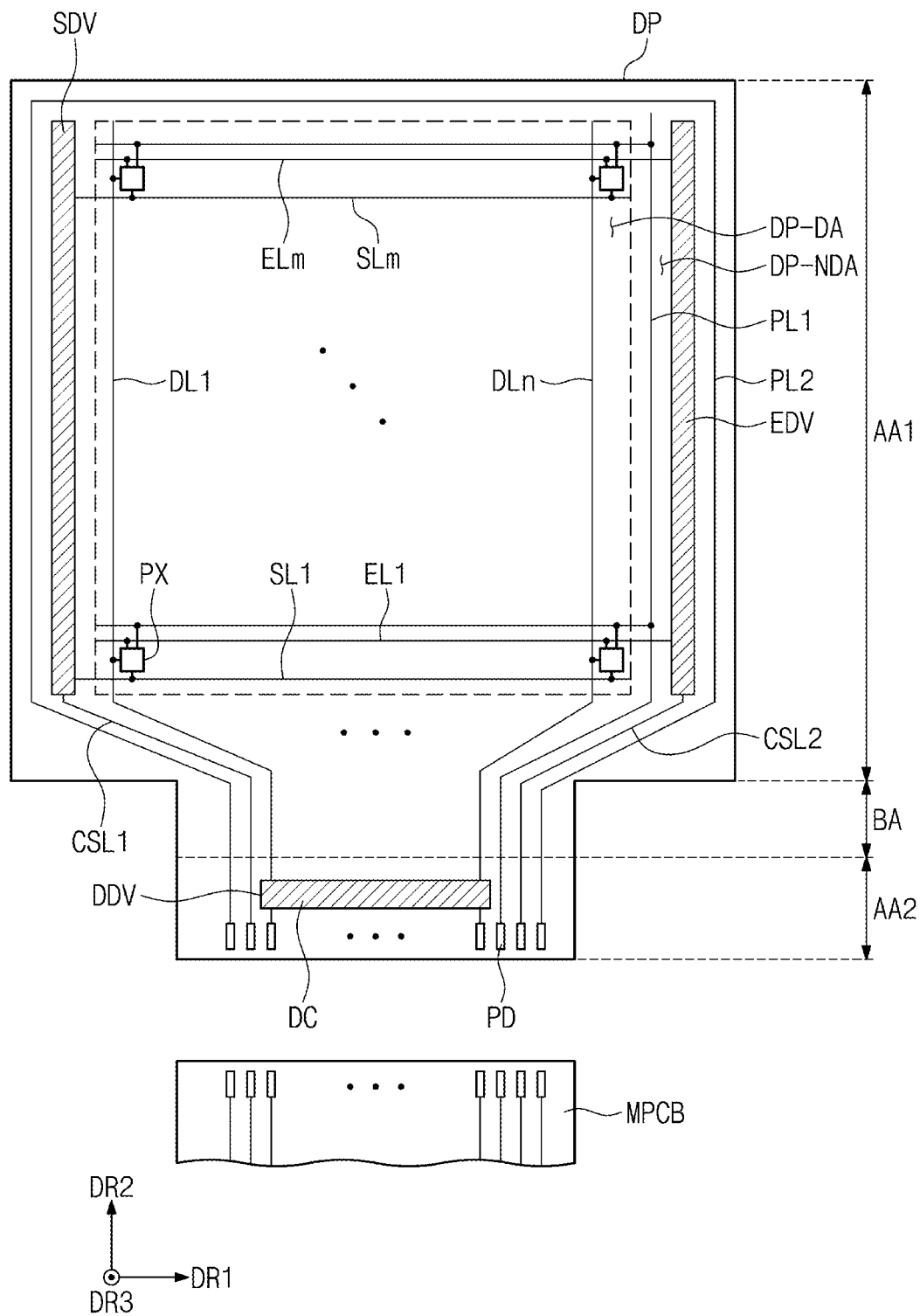
FIG. 2B is a plan view illustrating a display panel according to an embodiment of the inventive concept.

FIG. 2A is an exploded perspective view illustrating some components of an electronic device according to an embodiment of the inventive concept. FIG. 2B is a plan view illustrating a display panel according to an embodiment of the inventive concept. FIG. 2A illustrates the display panel DP, the circuit board MPCB, and the electronic module EM among the components of the electronic device EA illustrated in FIG. 1B, and a state before the display panel DP is bent is illustrated for convenience of description.

Referring to FIG. 2A, the electronic device EA includes the display panel DP, the circuit board MPCB, and the electronic module EM.

The display panel DP may be a component that generates an image and senses an input applied from the outside. The electronic module EM may be disposed below the display panel DP and may be, for example, a camera module or a sensor module.

The display area DP-DA and the peripheral area DP-NDA may be defined in the display panel DP. The display area DP-DA may correspond to the display area DA illustrated in FIG. 1A. A partial area of the display panel DP may have a higher transmittance than another partial area thereof. For example, transmittance of a sensing area DP-SA of the display panel DP may be higher than transmittance of the other portion of the display area DP-DA around the sensing area DP-SA. The sensing area DP-SA may be a portion of the display area DP-DA. That is, the sensing area DP-SA may display an image and may transmit an external input received to the electronic module EM or an output from the electronic module EM. In this specification, hereinafter, the sensing area DP-SA of the display area DP-DA may be referred to as a second display area, and the other portion of the display area DP-DA around the sensing area DP-SA may be referred to as a first display area.

The circuit board MPCB electrically bonded to the display panel DP may be disposed below the display panel DP when the display panel DP is bent. The circuit board MPCB may be disposed at one end of the display panel DP and may be electrically connected to pads included in the display panel DP.

A board opening MP may be included in the circuit board MPCB. The board opening MP may be formed to penetrate the circuit board MPCB. Although illustrated as a hole shape in FIG. 2A, the board opening MP illustrated therein is one example and is not limited thereto and may also have a bay shape obtained by recessing the circuit board MPCB to a predetermined depth from one side of the circuit board MPCB. When the display panel DP is bent and the circuit board MPCB is disposed below the display panel DP, the board opening MP may be positioned to overlap the sensing area DP-SA of the display panel DP. When the display panel DP is bent and the circuit board MPCB is disposed below the display panel DP, the electronic module EM may be disposed in the board opening MP. The electronic module EM may be disposed in the board opening MP and electrically connected to the circuit board MPCB. As the electronic module EM is disposed in the board opening MP, the electronic module EM and the circuit board MPCB may not overlap each other when viewed in a plane.

Referring to FIG. 2A and FIG. 2B together, the display panel DP may include the display area DP-DA and the peripheral area DP-NDA adjacent to the display area DP-DA. The display area DP-DA and the peripheral area DP-NDA are distinguished according to whether or not pixels PX are disposed. The display area DP-DA and the peripheral area DP-NDA respectively correspond to the display area DA and a peripheral area of the electronic device EA illustrated in FIG. 1A and FIG. 1B. In this specification, "an area/portion corresponds to another area/portion" means that the two areas/portions overlap each other at least partly when viewed in a plane, and the two areas/portions are not limited to having the same surface area. A scan driver SDV, a data driver DDV, an emission driver EDV, and the like may be disposed in the peripheral area DP-NDA.

The display panel DP includes a first area AA1, a second area AA2, and a bendable area BA divided in the second direction DR2. In the electronic device EA assembled as in FIG. 1A, the first area AA1 and the second area AA2 of the display panel DP may be disposed on different planes. The bendable area BA is disposed between the first area AA1 and the second area AA2. As illustrated in FIG. 1B, the second area AA2 may be disposed, as the bendable area BA is bent, on a plane different from a plane on which the first area AA1 is disposed. FIG. 2A and FIG. 2B illustrate an unfolded/unbent state of the display panel DP before the display panel DP is mounted in the electronic device EA.

The first area AA1 is an area overlapping the display area DP-DA. In the second direction DR2, lengths of the bendable area BA and the second area AA2 may be shorter than a length of the first area AA1. The second area AA2 and the bendable area BA may be a partial area of the peripheral area DP-NDA. In this specification, the first area AA1 may be referred to as a first non-bendable area, and the second area AA2 may be referred to as a second non-bendable area.

The display panel DP may include the plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, and a plurality of pads PD. Here, m and n are natural numbers. The pixels PX may be connected to the scan lines SL1 to SLm, the data lines DL1 to DLn, and the emission lines EL1 to ELm.

A driving circuit DC may be disposed in the second area AA2. The driving circuit DC may be the data driver DDV. The driving circuit DC may be an integrated circuit chip. The scan lines SL1 to SLm may extend in the first direction DR1 to be connected to the scan driver SDV. The data lines DL1 to DLn may extend in the second direction DR2 and may be connected to the driving circuit DC via the bendable area BA. The emission lines EL1 to ELm may extend in the first direction DR1 to be connected to the emission driver EDV The first power line PL1 may include a portion extending in the first direction DR1 and a portion extending in the second direction DR2. The portion extending in the first direction DR1 and the portion extending in the second direction DR2 may be disposed on different layers. The portion extending in the second direction DR2 of the first power line PL1 may extend to the second area AA2 via the bendable area BA. The first power line PL1 may provide a first voltage to the pixels PX.

The second power line PL2 may be disposed in the peripheral area DP-NDA along an edge of the first area AA1. The second power line PL2 may be disposed more outward than the scan driver SDV and the emission driver EDV The first control line CSL1 may be connected to the scan driver SDV and may extend toward a lower end of the second area AA2 via the bendable area BA. The second control line CSL2 may be connected to the emission driver EDV and may extend toward the lower end of the second area AA2 via the bendable area BA.

When viewed in a plane, the pads PD may be disposed adjacent to the lower end of the second area AA2. The driving circuit DC, the first power line PL1, the second power line PL2, the first control line CSL1, and the second control line CSL2 may be connected to the pads PD. The circuit board MPCB may be electrically connected to the pads PD. Although not illustrated, the circuit board MPCB may be electrically connected to the pads PD through an anisotropic conductive adhesive layer.

Each of the pixels PX may include a light emitting element and a pixel circuit that is configured to control light emission of the light emitting element. The pixel circuit includes a plurality of transistors and at least one capacitor.

Figure 3A:
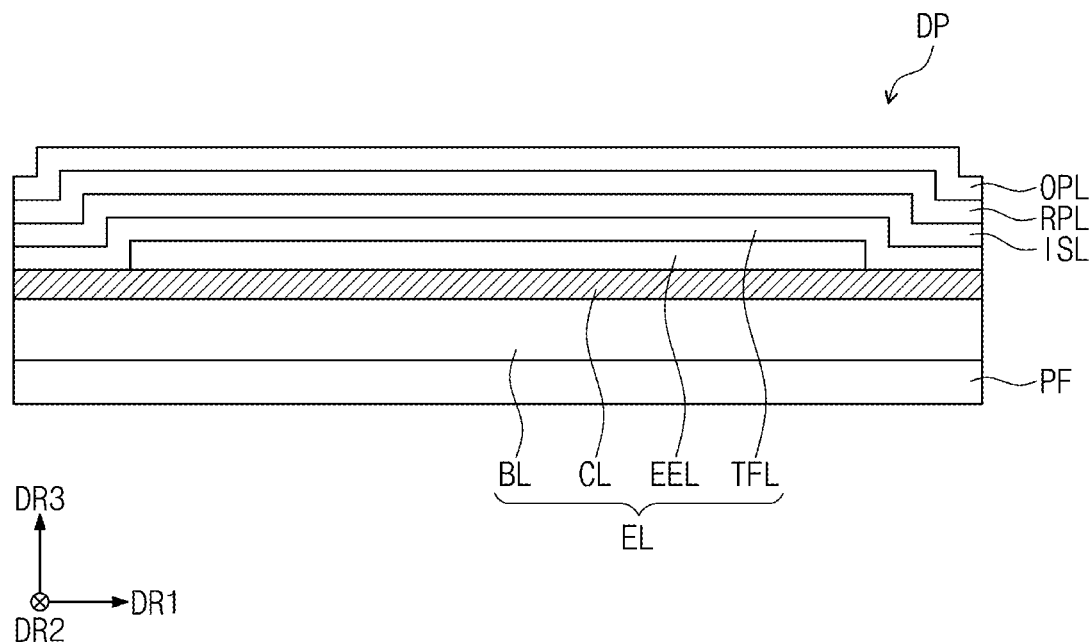
FIG. 3A, 3B, and FIG. 3C are each a cross-sectional view illustrating a display panel according to an embodiment of the inventive concept.

FIG. 3A is a cross-sectional view illustrating a display panel DP according to an embodiment of the inventive concept.

Referring to FIG. 3A, the display panel DP may include a display layer EL, a sensor layer ISL, an anti-reflection layer RPL, and an optical layer OPL.

The display layer EL may be a component that substantially generates an image. The display layer EL may be a light emitting display layer and may be, for example, an organic light emitting display layer, a quantum dot display layer, or a micro LED display layer.

The display layer EL may include a base layer BL, a circuit layer CL, a light emitting element layer EEL, and an encapsulation layer TFL.

The base layer BL may be a member that provides a base surface on which the circuit layer CL is disposed. The base layer BL may be a glass substrate, a metal substrate, a polymer substrate, or the like. However, an embodiment is not limited thereto, and the base layer BL may be an inorganic layer, an organic layer, or a composite material layer.

The base layer BL may have a multilayer structure. For example, the base layer BL may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include polyimide-based resin. In addition, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. In this specification, meanwhile, "~~"-based resin may refer to that the "~~"-based resin includes a functional group of "~~".

The circuit layer CL may be disposed on the base layer BL. The circuit layer CL may include insulating layers, a semiconductor pattern, a conductive pattern, a signal line, and the like. Each of the insulating layers, a semiconductor layer, and a conductive layer may be formed on the base layer BL in a method such as coating and deposition, and thereafter, the insulating layer, the semiconductor layer, and the conductive layer may be selectively patterned through a plurality of photolithography processes. Thereafter, the semiconductor pattern, the conductive pattern, and the signal line included in the circuit layer CL may be formed.

The light emitting element layer EEL may be disposed on the circuit layer CL and receive electrical signals from the circuit layer CL. The light emitting element layer EEL may include the light emitting element. For example, the light emitting element layer EEL may include an organic light emitting material, quantum dots, quantum rods, or a micro LED.

The encapsulation layer TFL may be disposed on the light emitting element layer EEL. The encapsulation layer TFL may protect the light emitting element layer EEL from foreign matter such as moisture, oxygen, and dust particles.

The sensor layer ISL may be disposed on the display layer EL. The sensor layer ISL may sense an external input applied from the outside. The external input may be a user's input. The user's input may include various types of external inputs such as a part of the user's body, light, heat, a pen, and pressure.

The sensor layer ISL may be formed on the display layer EL through a continuous process. In this case, the sensor layer ISL may be said to be directly disposed on the display layer EL. The expression "directly disposed" may refer to that a third component is not disposed between the sensor layer ISL and the display layer EL. That is, a separate adhesive member may not be disposed between the sensor layer ISL and the display layer EL.

Alternatively, the sensor layer ISL may be bonded to the display layer EL by an adhesive member. The adhesive member may include a typical adhesive or a typical detachable adhesive. For example, the adhesive member may be a pressure sensitive adhesive. For example, the adhesive member may include an acrylate-based compound or a silicone-based compound. For example, the acrylate-based compound may be buthylacrylate, ethylacrylate, acryl, or a mixture thereof. However, a material of the adhesive member is not limited to the above examples.

The anti-reflection layer RPL may be disposed on the sensor layer ISL. The anti-reflection layer RPL may reduce the degree of reflection of external light incident from outside of the display panel DP. The anti-reflection layer RPL may be formed on the sensor layer ISL through a continuous process. The anti-reflection layer RPL may include color filters. The color filters may have a predetermined arrangement. For example, the color filters may be arranged in consideration of emission colors of the pixels PX included in the display layer EL. In addition, the anti-reflection layer RPL may further include a black matrix adjacent to the color filters.

The optical layer OPL may be disposed on the anti-reflection layer RPL. The optical layer OPL may be formed on the anti-reflection layer RPL through a continuous process. The optical layer OPL may control a direction of light incident from the display layer EL to improve front luminance of the display panel DP. For example, the optical layer OPL may include an organic insulating layer in which openings are defined respectively corresponding to light emitting areas of the pixels PX included in the display layer EL, and a high refractive index layer which covers the organic insulating layer and is filled in the openings. The high refractive index layer may have a higher refractive index than the organic insulating layer.

The organic insulating layer may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, or perylene-based resin. The high refractive index layer may include siloxane-based resin. In addition to the siloxane-based resin, the high refractive index layer may include at least one of zirconium oxide particles, aluminum oxide particles, or titanium oxide particles.

Light emitted from the pixels PX may be provided to the optical layer OPL. Because of a difference in refractive index between the high refractive index layer and the organic insulating layer, the light may be reflected from a side of the organic insulating layer in which the openings are defined. The light is reflected from the side of the organic insulating layer in which the openings are defined, so that a traveling direction of the light may be controlled, and accordingly, the front luminance of the display panel DP may be improved.

In an embodiment of the inventive concept, at least one of the anti-reflection layer RPL or the optical layer OPL may be omitted. That is, in the display panel DP according to an embodiment of the inventive concept, the anti-reflection layer RPL may be omitted, and additionally, a disposition relationship may be changed differently from that illustrated in FIG. 3A. For example, the optical layer OPL may be provided in a state of being included in the sensor layer ISL, and additionally, the anti-reflection layer RPL may also be provided in a state of being included in the sensor layer ISL. In this case, the function of the anti-reflection layer RPL or the optical layer OPL may be implemented by using insulating layers constituting the sensor layer ISL.

The display panel DP may further include a protective layer PF. The protective layer PF may be disposed on a lower portion of the base layer BL. The protective layer PF may protect other components of the display panel DP from external impact. In addition, the protective layer PF may prevent scratches from occurring on rear surfaces of other components of the display panel DP during manufacturing processes of the display panel DP. The protective layer PF may be a flexible film. Because the protective layer PF is a flexible film, defects such as cracking and tearing may not occur that may be caused by repeated operations of folding and unfolding the electronic device EA. The protective layer PF may be a film having a high light transmittance. The protective layer PF may include a polyethylene terephtalate (PET) film.

Figure 3B:
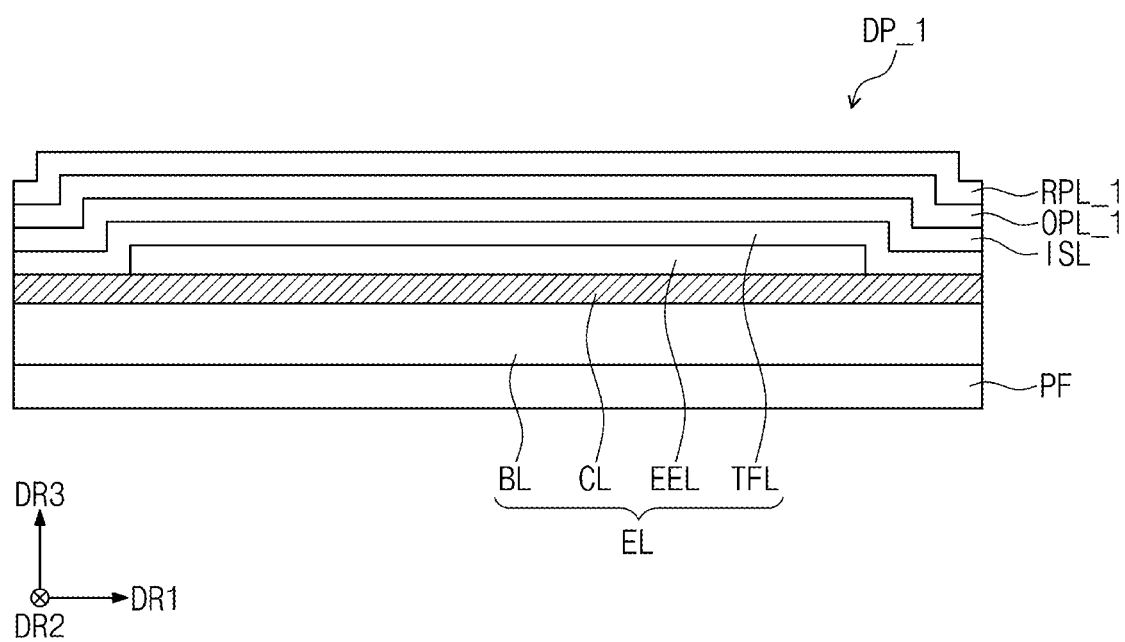

FIG. 3B is a cross-sectional view illustrating a display panel according to an embodiment of the inventive concept.

Referring to FIG. 3B, a display panel DP_1 may include a display layer EL, a sensor layer ISL, an optical layer OPL_1, and an anti-reflection layer RPL_1. The display panel DP_1 of FIG. 3B has a difference in a laminating order of the optical layer OPL_1 and the anti-reflection layer RPL_1 when compared with the display panel DP of FIG. 3A described above.

The optical layer OPL_1 may be disposed on the sensor layer ISL. The optical layer OPL_1 may be formed on the sensor layer ISL through a continuous process. The optical layer OPL_1 may control a direction of light incident from the display layer EL to improve front luminance of the display panel DP_1.

The anti-reflection layer RPL_1 may be disposed on the optical layer OPL_1. The anti-reflection layer RPL_1 may reduce the degree of reflection of external light incident from outside of the display panel DP_1. The anti-reflection layer RPL_1 may include a polarizing film, and the polarizing film may include a retarder and/or a polarizer. Although not illustrated, the anti-reflection layer RPL_1 may be bonded to the optical layer OPL_1 through an adhesive layer. The adhesive layer may be a transparent adhesive layer such as a pressure sensitive adhesive (PSA) film, an optically clear adhesive (OCA) film, and an optically clear resin (OCR).

In an embodiment of the inventive concept, at least one of the anti-reflection layer RPL_1 or the optical layer OPL_1 may be omitted. Alternatively, the optical layer OPL_1 may be provided in a state of being included in the sensor layer ISL. In this case, a layer implementing the function of the optical layer OPL_1 may be provided by using insulating layers constituting the sensor layer ISL.

Figure 3C:
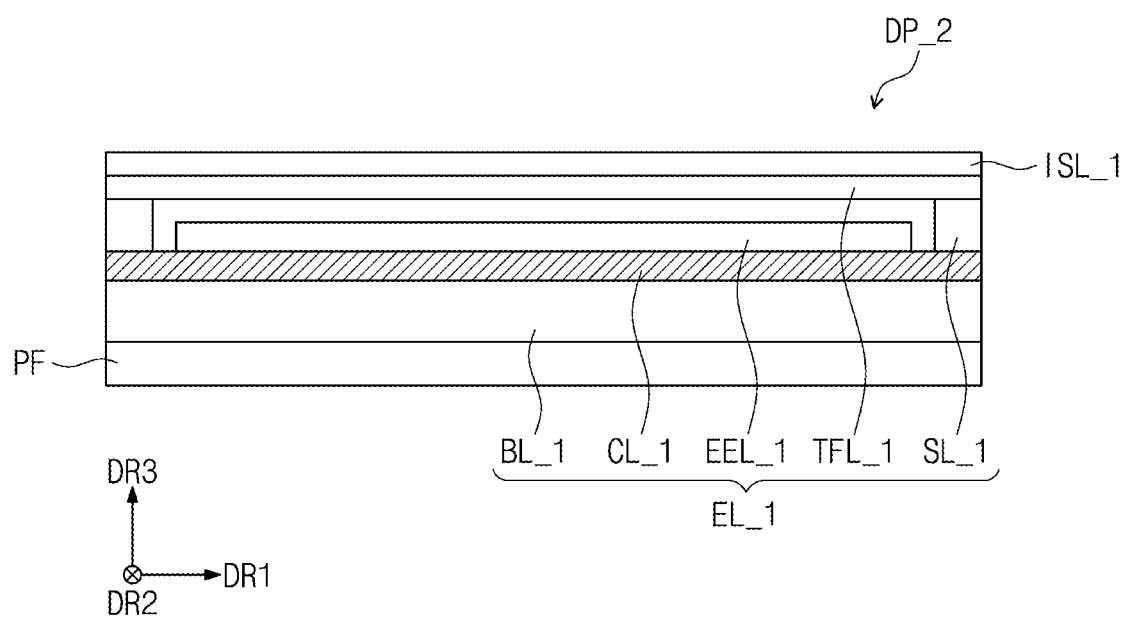

FIG. 3C is a cross-sectional view illustrating a display panel according to an embodiment of the inventive concept.

Referring to FIG. 3C, a display panel DP_2 may include a display layer EL_1 and a sensor layer ISL_1. The display layer EL_1 may include a base substrate BL_1, a circuit layer CL_1, a light emitting element layer EEL_1, an encapsulation substrate TFL_1, and a bonding member SL_1.

Each of the base substrate BL_1 and the encapsulation substrate TFL_1 may be a glass substrate, a metal substrate, or a polymer substrate but is not particularly limited thereto.

The bonding member SL_1 may be disposed between the base substrate BL_1 and the encapsulation substrate TFL_1. The bonding member SL_1 may bond the encapsulation substrate TFL_1 to the base substrate BL_1 or the circuit layer CL_1. The bonding member SL_1 may include an inorganic material or an organic material. For example, the inorganic material may include a frit seal, and the organic material may include photocurable resin or photoplastic resin. However, a material constituting the bonding member SL_1 is not limited to the above examples.

The sensor layer ISL_1 may be directly disposed on the encapsulation substrate TFL_1. The expression "directly disposed" may refer to that a third component is not disposed between the sensor layer ISL_1 and the display layer EL_1. That is, a separate adhesive member may not be disposed between the sensor layer ISL_1 and the display layer EL_1. However, an embodiment of the inventive concept is not limited thereto, and an adhesive layer may be further disposed between the sensor layer ISL_1 and the encapsulation substrate TFL_1.

Figure 4:
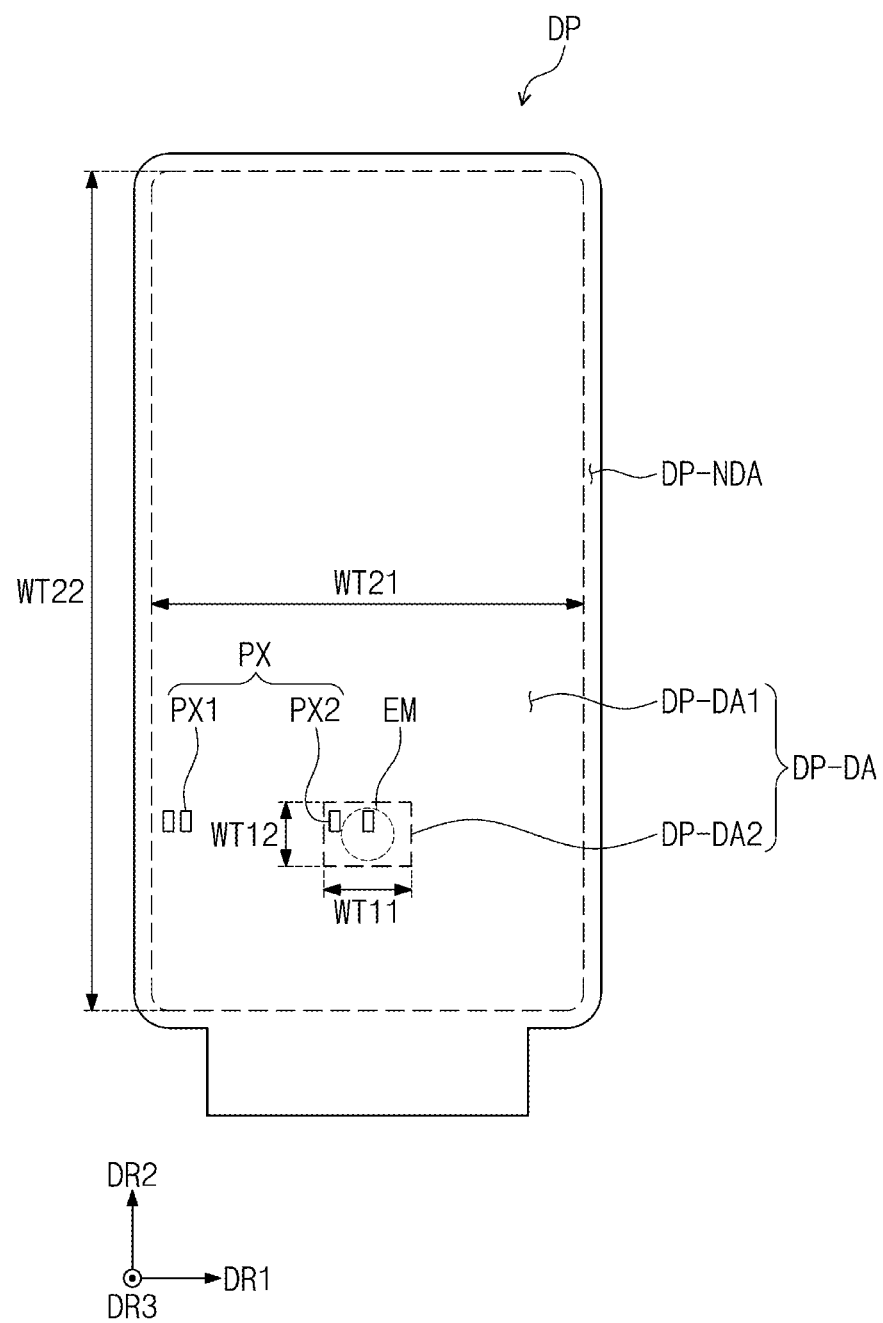
FIG. 4 is a plan view illustrating a display panel according to an embodiment of the inventive concept.

FIG. 4 is a plan view illustrating a display panel according to an embodiment of the inventive concept.

Referring to FIG. 4, the display area DP-DA may include a first display area DP-DA1 and a second display area DP-DA2. The electronic module EM may be disposed below the second display area DP-DA2. That is, the sensing area DP-SA (see FIG. 2A) may be included in the second display area DP-DA2.

The plurality of pixels PX (hereinafter, the pixels PX) may be disposed in the display area DP-DA. Each of the pixels PX may include the light emitting element and the pixel circuit electrically connected to the light emitting element. The pixels PX may include first pixels PX1 disposed in the first display area DP-DA1 and second pixels PX2 disposed in the second display area DP-DA2.

Transmittances of the first display area DP-DA1 and the second display area DP-DA2 may be different from each other. For example, the transmittance of the second display area DP-DA2 may be higher than the transmittance of the first display area DP-DA1.

To make the transmittance of the second display area DP-DA2 higher than the transmittance of the first display area DP-DA1, at least some of components disposed in the second display area DP-DA2 may be omitted or may be moved to be disposed in an area other than the second display area DP-DA2.

Density of the second pixels PX2 disposed in the second display area DP-DA2 may be lower than density of the first pixels PX1 disposed in the first display area DP-DA1. In this case, resolution of the second display area DP-DA2 may be lower than resolution of the first display area DP-DA1, but the transmittance of the second display area DP-DA2 may be higher than the transmittance of the first display area DP-DA1.

The light emitting element of each of the second pixels PX2 may be disposed in the second display area DP-DA2, and the pixel circuit of each of the second pixels PX2 may be disposed in the peripheral area DP-NDA. In this case, transmittance of the second display area DP-DA2 may be higher than the transmittance of the case that the pixel circuit of each of the second pixels PX2 is disposed in the second display area DP-DA2.

The second display area DP-DA2 may have a quadrangular shape. At least three sides of the second display area DP-DA2 may come in contact with the first display area DP-DA1. However, an embodiment of the inventive concept is not limited thereto. For example, depending on the position of the electronic module EM, the first display area DP-DA1 may completely surround the second display area DP-DA2.

A maximum width WT11 of the second display area DP-DA2 in the first direction DR1 may be smaller than a maximum width WT21 of the first display area DP-DA1 in the first direction DR1. Also, a maximum width WT12 of the second display area DP-DA2 in the second direction DR2 may be smaller than a maximum width WT22 of the first display area DP-DA1 in the second direction DR2. The maximum width WT21 of the first display area DP-DA1 may be a maximum width of the display area DP-DA in the first direction DR1, and the maximum width WT22 of the first display area DP-DA1 may be a maximum width of the display area DP-DA in the second direction DR2.

Figure 5A:
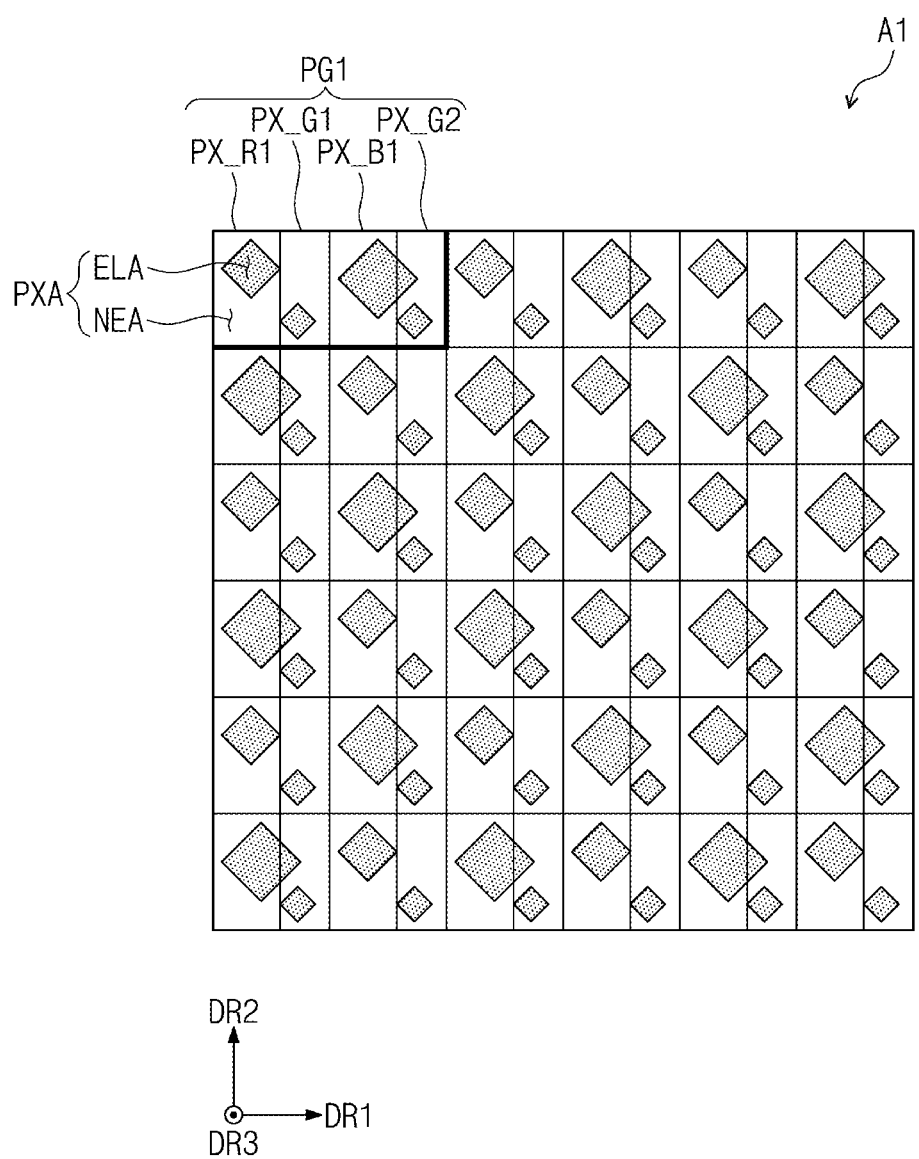
FIG. 5A is an enlarged plan view illustrating a portion of a first display area according to an embodiment of the inventive concept.
Figure 5B:
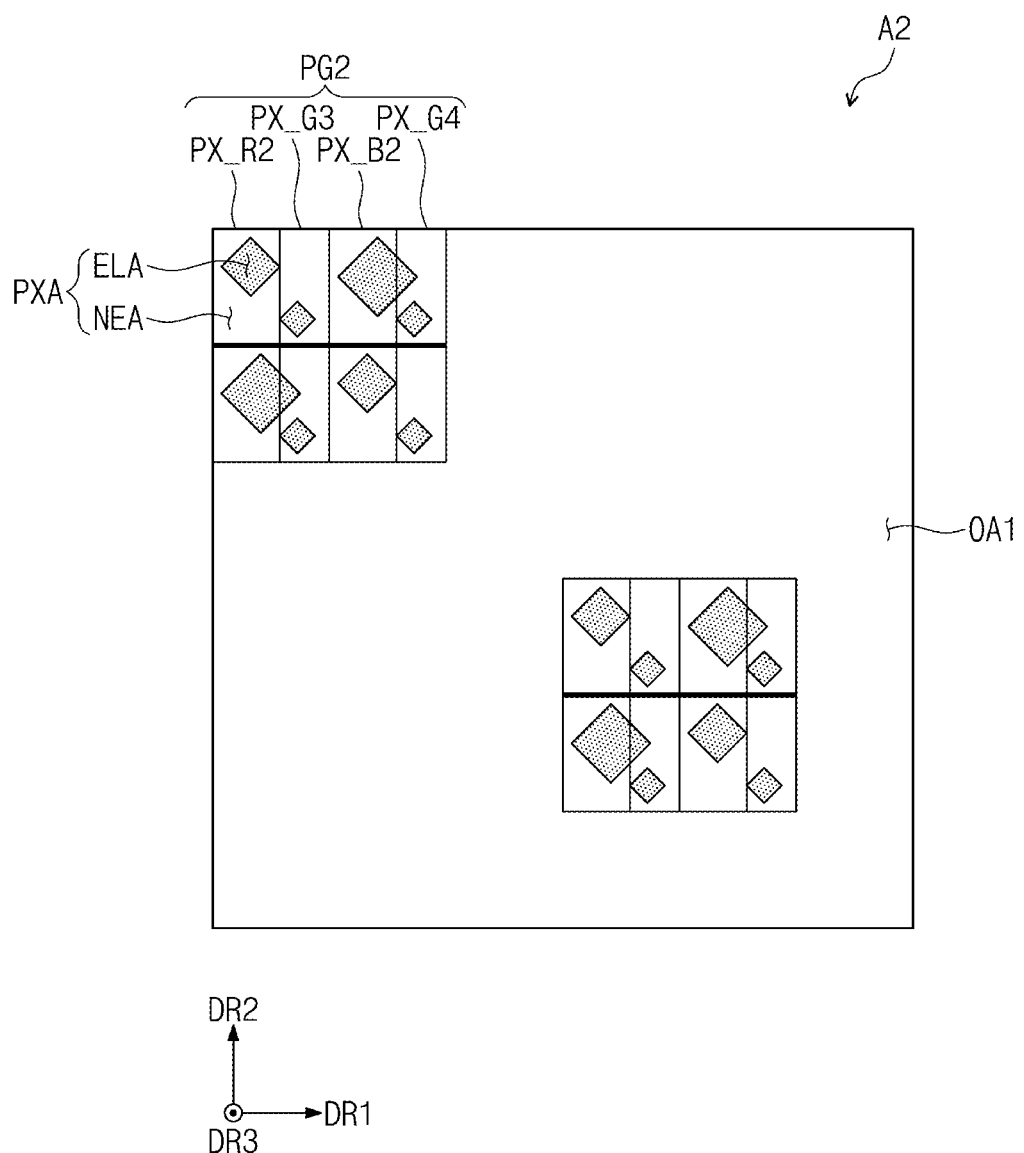
FIG. 5B is an enlarged plan view illustrating a portion of a second display area according to an embodiment of the inventive concept.

FIG. 5A is an enlarged plan view illustrating a portion of a first display area according to an embodiment of the inventive concept. FIG. 5B is an enlarged plan view illustrating a portion of a second display area according to an embodiment of the inventive concept.

Referring to FIG. 4 and FIG. 5A, the plurality of first pixels PX1 may be arranged in the first display area DP-DA1. The first pixels PX1 may be arranged to be spaced apart from each other in the first direction DR1 and the second direction DR2.

The first pixels PX1 may include a plurality of red pixels PX_R1, a plurality of green pixels PX_G1 and PX_G2, and a plurality of blue pixels PX_B1. The first pixels PX1 may be grouped into a plurality of first pixel groups PG1. For example, each of the first pixel groups PG1 may include one first red pixel PX_R1, two first green pixels PX_G1 and PX_G2, and one first blue pixel PX_B1. A portion of first blue pixels PX_B1 may extend into a space allotted for first green pixels PX_G2. Each of the first pixels PX1 of the first pixel group PG1 may include a light emitting area ELA and a non-light emitting area NEA. The light emitting area ELA may have a quadrangular shape as an example of an embodiment of the inventive concept but is not limited thereto. A first light emitting element may be disposed in the light emitting area ELA, and the transistors configured to drive the first light emitting element may be disposed in the non-light emitting area NEA.

The plurality of first pixel groups PG1 may be disposed in a first pixel area A1 of the first display area DP-DA1. The first pixel area A1 may refer to an area having a unit surface area among the first display area DP-DA1.

The first pixel groups PG1 may be arranged in a matrix form in the first pixel area A1. For example, the plurality of first pixel groups PG1 may be arranged to be spaced apart from each other in the first direction DR1 and the second direction DR2.

Bold horizontal and vertical lines are drawn to illustrate a boundary of one of the first pixel groups PG1. Although 18 first pixel groups PG1 are illustrated to be disposed in the first pixel area A1, this is an exemplary illustration for convenience of description, and an embodiment of the inventive concept is not limited thereto. The number of the first pixel groups PG1 disposed in the first pixel area A1 may be larger.

Although the shape of each of the first pixels PX1 is illustrated as a quadrangular shape for convenience of description, this is illustrated by way of example, and each of the first pixels PX1 may substantially have various shapes. For example, each of the first pixels PX1 may include the light emitting element and the transistors. The area in which the light emitting element and the transistors are disposed is not limited to the quadrangular area.

Referring to FIG. 4 and FIG. 5B, the plurality of second pixels PX2 may be disposed in a second pixel area A2 of the second display area DP-DA2. The second pixel area A2 may include pixel areas PXA in which the plurality of second pixels PX2 are respectively disposed and a plurality of opening areas OA1. The pixels PX may not be substantially disposed in the opening areas OA1. That is, the opening areas OA1 may be areas from which some components of the second pixels PX2, for example, a second light emitting element, have been removed. Accordingly, resolution of the first display area DP-DA1 may be, for the unit surface area, higher than resolution of the second display area DP-DA2.

The second pixels PX2 may be grouped into a plurality of second pixel groups PG2. For example, each of the second pixel groups PG2 may include one second red pixel PX R2, two second green pixels PX G3 and PX_G4, and one second blue pixel PX_B2. A portion of second blue pixels PX_B2 may extend into a space allotted for second green pixels PX_G4. Each of the pixel areas PXA may include the light emitting area ELA and the non-light emitting area NEA. The light emitting area ELA may have a quadrangular shape as an example of an embodiment of the inventive concept but is not limited thereto. The second light emitting element may be disposed in the light emitting area ELA, and the transistors configured to drive the second light emitting element may be disposed in the non-light emitting area NEA.

Like the first pixel area A1, the second pixel area A2 may be an area having the unit surface area. That is, the second pixel area A2 and the first pixel area A1 may have the same surface area.

Bold horizontal lines are drawn to illustrate boundaries between the second pixel groups PG2. Four second pixel groups PG2 may be disposed in the second pixel area A2. That is, the number of the second pixel groups PG2 disposed in the second pixel area A2 may be smaller than the number of the first pixel groups PG1 disposed in the first pixel area A1. Portions of the second pixel area A2 other than the pixel areas PXA in which the second pixel groups PG2 are disposed may be the opening areas OA1. The opening areas OA1 may be an optical path through which light provided from the outside is transmitted. Accordingly, sensors disposed in the second display area DP-DA2 may sense light transmitted through the opening areas OA1 to detect input information of a user.

When areas of the second pixel area A2 in which the second pixel groups PG2 are disposed are the plurality of pixel areas PXA, a total surface area of the pixel areas PXA in the second pixel area A2 may be smaller than a total surface area of the opening areas OA1 therein. However, an embodiment of the inventive concept is not limited thereto, and the total surface area of the pixel areas PXA in the second pixel area A2 may be equal to or larger than the total surface area of the opening areas OA1.

Figure 6:
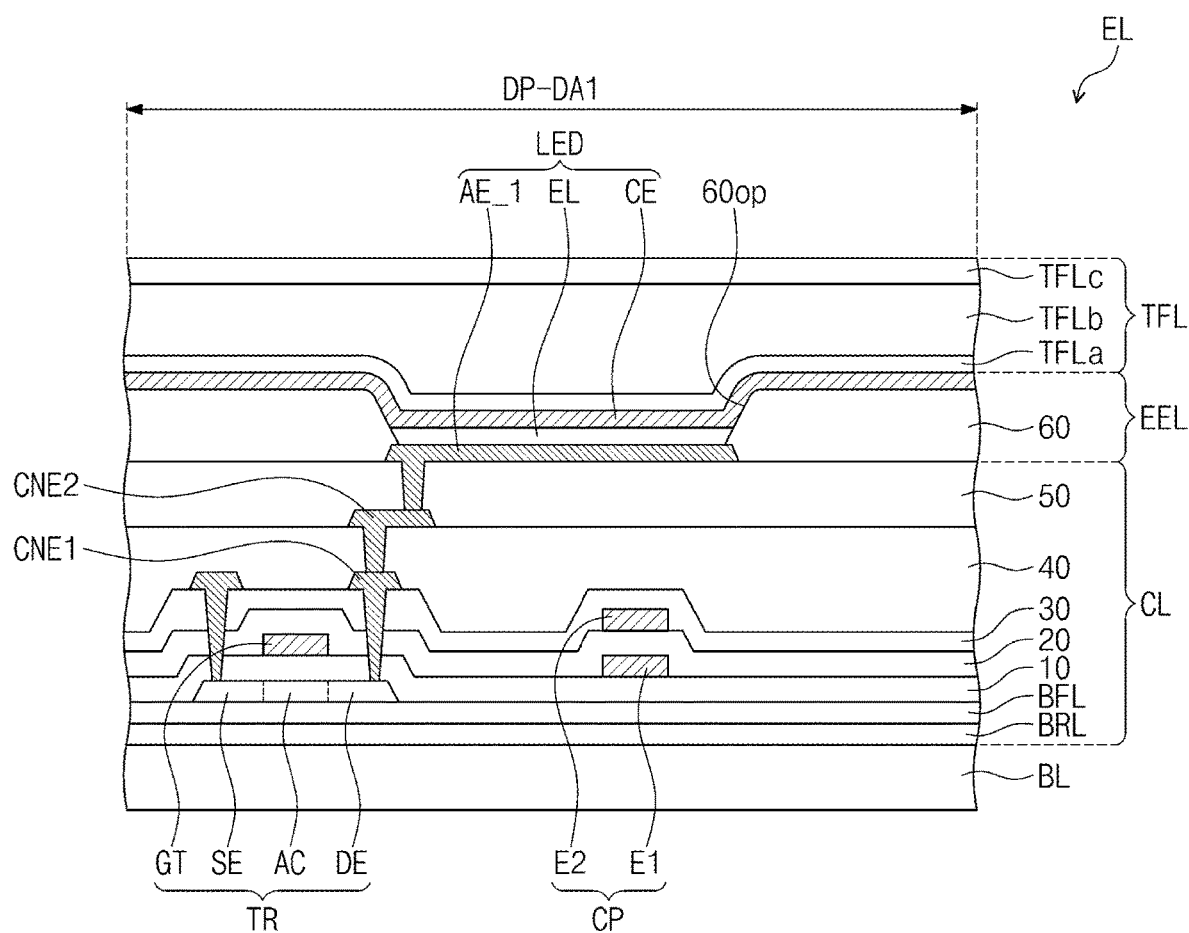
FIG. 6 is a cross-sectional view illustrating a display layer according to an embodiment of the inventive concept.

FIG. 6 is a cross-sectional view illustrating a display layer according to an embodiment of the inventive concept.

Referring to FIG. 6, the display layer EL may include the plurality of insulating layers, the semiconductor pattern, the conductive pattern, the signal line, and the like. Each of the insulating layers, a semiconductor layer, and a conductive layer are formed in a method such as coating and deposition. Thereafter, the insulating layer, the semiconductor layer, and the conductive layer may be selectively patterned in a photolithography method. In this manner, the semiconductor pattern, the conductive pattern, the signal line, and the like included in the circuit layer CL and the light emitting element layer EEL are formed. Thereafter, the encapsulation layer TFL covering the light emitting element layer EEL may be formed.

At least one inorganic layer is formed on a top surface of the base layer BL. The inorganic layer may include at least one of aluminum oxide, titanium oxide, silicon oxide, silicon nitride, silicon oxynitride, zirconium oxide, or hafnium oxide. The inorganic layer may be formed in multiple inorganic layers. The multiple inorganic layers may constitute a barrier layer BRL and/or a buffer layer BFL.

The barrier layer BRL may be disposed on the base layer BL. The barrier layer BRL may include at least one of silicon oxide, silicon nitride, or silicon oxynitride. The buffer layer BFL may be disposed on the barrier layer BRL. The buffer layer BFL may improve bonding force between the base layer BL and the semiconductor pattern. The buffer layer BFL may include at least one of silicon oxide, silicon nitride, or silicon oxynitride. For example, the buffer layer BFL may include a structure in which a silicon oxide layer and a silicon nitride layer are alternately laminated.

The semiconductor pattern may be disposed on the buffer layer BFL. The semiconductor pattern may include polysilicon. However, the semiconductor pattern is not limited thereto and may also include amorphous silicon or an oxide semiconductor. The semiconductor pattern may be provided in plurality.

FIG. 6 illustrates only some of the semiconductor patterns, and another of the semiconductor patterns may be further disposed in another area. The semiconductor patterns may be arranged in a specific rule across the pixels PX. The semiconductor pattern may have different electrical properties depending on whether the same is doped. The semiconductor pattern may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped in a lower concentration than the first region.

The first region may have a higher conductivity than the second region and may substantially serve as an electrode or the signal line. The second region may substantially correspond to an active (or a channel) of each of the transistors. In other words, a portion of the semiconductor pattern may be the active of the transistor, another portion may be a source or a drain of the transistor, and yet another portion may be a connection electrode or a connection signal line.

FIG. 6 exemplarily illustrates one transistor and the light emitting element included in each of the pixels. FIG. 6 is a cross-sectional view of the first display area DP-DA1.

A source SE, an active AC, and a drain DE of a transistor TR may be formed from the semiconductor pattern. The source SE and the drain DE may respectively extend in opposite directions from the active AC when viewed on a cross section.

A first insulating layer 10 may be disposed on the buffer layer BFL. The first insulating layer 10 may overlap the plurality of pixels PX in common and may cover the semiconductor pattern. The first insulating layer 10 may be an inorganic layer and/or an organic layer and may have a single-layer structure or a multilayer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. In addition to the first insulating layer 10, an insulating layer of the circuit layer CL to be described later may be an inorganic layer and/or an organic layer and may have a single-layer structure or a multilayer structure. The inorganic layer may include at least one of the above-described materials but is not limited thereto.

A gate GT of the transistor TR is disposed on the first insulating layer 10. The gate GT may be a portion of a metal pattern. The gate GT overlaps the active AC. In a process of doping the semiconductor pattern, the gate GT may function as a mask.

A second insulating layer 20 may be disposed on the first insulating layer 10 and may cover the gate GT. The second insulating layer 20 may be an inorganic layer and/or an organic layer and may have a single-layer structure or a multilayer structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

A capacitor CP may include a first electrode E1 and a second electrode E2 facing the first electrode E1. The first electrode E1 may be disposed on the same layer as the gate GT and may include the same material as the gate GT. For example, the first electrode E1 may be disposed between the first insulating layer 10 and the second insulating layer 20. The second electrode E2 may be disposed on the second insulating layer 20. The position of the capacitor CP is not limited to the example illustrated in FIG. 6. For example, the capacitor CP may be disposed on an additional transistor. That is, the capacitor CP may overlap the additional transistor. Therethrough, a surface area or a space in which the pixel circuit or the like is to be formed may be secured.

A third insulating layer 30 may be disposed on the second insulating layer 20 and may cover the second electrode E2. The third insulating layer 30 may have a single-layer structure or a multilayer structure. For example, the third insulating layer 30 may have a multilayer structure including a silicon oxide layer and a silicon nitride layer. A first connection electrode CNE1 may be disposed on the third insulating layer 30. The first connection electrode CNE1 may be connected to the drain DE of the transistor TR through a contact hole penetrating the first, second, and third insulating layers 10, 20, and 30.

A fourth insulating layer 40 may be disposed on the third insulating layer 30. The fourth insulating layer 40 may be an organic layer.

A second connection electrode CNE2 may be disposed on the fourth insulating layer 40. The second connection electrode CNE2 may be connected to the first connection electrode CNE1 through a contact hole penetrating the fourth insulating layer 40.

A fifth insulating layer 50 may be disposed on the fourth insulating layer 40 and may cover the second connection electrode CNE2. The fifth insulating layer 50 may be an organic layer.

The light emitting element layer EEL including a light emitting element LED may be disposed on the circuit layer CL. The light emitting element LED may include a first pixel electrode AE_1, a light emitting layer EEL, and a common electrode CE.

The first pixel electrode AE_1 may be disposed on the fifth insulating layer 50. The first pixel electrode AE_1 may be connected to the second connection electrode CNE2 through a contact hole penetrating the fifth insulating layer 50.

A pixel defining film 60 may be disposed on the fifth insulating layer 50 and may cover a portion of the first pixel electrode AE_1. An opening 60op is included in the pixel defining film 60. The opening 60op of the pixel defining film 60 exposes at least a portion of the first pixel electrode AE_1.

The light emitting layer EEL may be disposed on the first pixel electrode AE_1. The light emitting layer EEL may be provided in plurality. The light emitting layer EEL may be disposed in an area corresponding to the opening 60op. That is, the light emitting layers EEL may be formed separately in each of the pixels PX. When the light emitting layers EEL are formed separately in each of the pixels PX, each of the light emitting layers EEL may emit light of at least one color of blue, red, or green. However, the light emitting layer EEL is not limited thereto and may be disposed in pixels PX in common. In this case, the light emitting layer EEL may provide blue light or white light.

The common electrode CE may be disposed on the light emitting layer EL. The common electrode CE may have an integral shape and may be disposed in common in the plurality of pixels PX.

Although not illustrated, a hole control layer may be disposed between the first pixel electrode AE_1 and the light emitting layer EEL. The hole control layer may include a hole transport layer and may further include a hole injection layer. An electron control layer may be disposed between the light emitting layer EEL and the common electrode CE. The electron control layer may include an electron transport layer and may further include an electron injection layer. The hole control layer and the electron control layer may be formed in common in the plurality of pixels PX by using an open mask.

The encapsulation layer TFL may be disposed on the light emitting element layer EEL. The encapsulation layer TFL may include an inorganic layer TFLa, an organic layer TFLb, and an inorganic layer TFLc sequentially laminated, but layers constituting the encapsulation layer TFL are not limited thereto.

The inorganic layers TFLa and TFLc may protect the light emitting element layer EEL from moisture and oxygen, and the organic layer TFLb may protect the light emitting element layer EEL from foreign matter such as dust particles. The inorganic layers TFLa and TFLc may include a silicon nitride layer, a silicon oxynitride layer, a silicon oxide layer, a titanium oxide layer, an aluminum oxide layer, or the like. The organic layer TFLb may include an acrylate-based organic layer but is not limited thereto.

Figure 7:
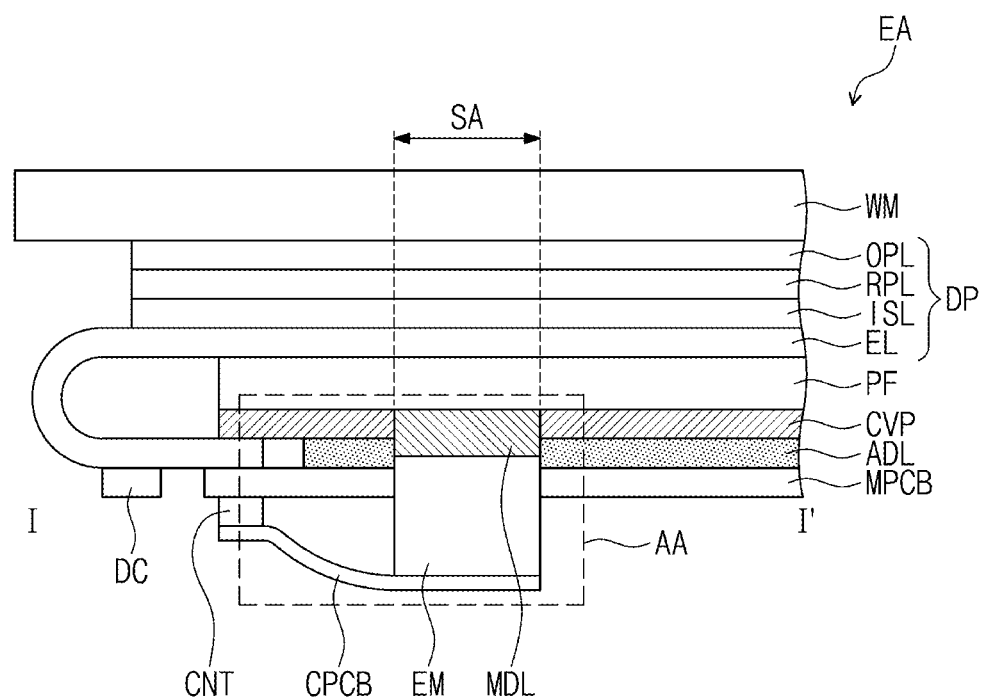
FIG. 7 is a cross-sectional view illustrating an electronic device according to an embodiment of the inventive concept.

FIG. 7 is a cross-sectional view illustrating an electronic device according to an embodiment of the inventive concept. FIG. 7 illustrates a cross section taken along line I-I' of FIG. 1A and FIG. 1B. In FIG. 7, the housing HU is omitted among the components illustrated in FIG. 1B and the remaining components are illustrated.

Referring to FIG. 7, the electronic device EA includes the display panel DP, the circuit board MPCB, the electronic module EM, and an intermediate layer MDL. The electronic device EA may further include the window WM disposed on the display panel DP and a cover layer CVP disposed on a lower portion of the display panel DP.

The display panel DP may include the display layer EL, the sensor layer ISL, the anti-reflection layer RPL, and the optical layer OPL that are sequentially laminated. The display panel DP may further include the protective layer PF disposed on a lower portion of the display layer EL. The display panel DP may further include the driving circuit DC mounted on one surface of the display panel DP. The driving circuit DC may be disposed on one surface of the display layer EL of the display panel DP. The driving circuit DC may be disposed on one surface of the base layer BL (see FIG. 3A).

The cover layer CVP may be disposed on the lower portion of the display panel DP. The cover layer CVP may be disposed on a bottom surface of the protective layer PF. The cover layer CVP may protect the display panel DP, the electronic module EM, and the like from a physical impact applied from outside of the electronic device EA.

The cover layer CVP may implement a hole that at least a portion among the electronic module EM and the intermediate layer MDL is inserted into, and may be provided with a predetermined thickness or more to absorb an impact applied to the electronic device EA.

The cover layer CVP may include a material having an excellent impact absorption capability and a certain strength value. For example, the cover layer CVP may be formed by including at least one of an acrylate-based polymer, a urethane-based polymer, a silicone-based polymer, or an imide-based polymer.

The electronic module EM may be disposed below the display panel DP and may be, for example, a camera module or a sensor module.

The intermediate layer MDL is disposed between the display panel DP and the electronic module EM. The intermediate layer MDL may bond the electronic module EM to a bottom surface of the display panel DP. The intermediate layer MDL may come in contact with a bottom surface of a lowermost component of the display panel DP. In an embodiment, the intermediate layer MDL may come in contact with a bottom surface of the protective layer PF disposed in a lowermost portion of the display panel DP. Alternatively, the protective layer PF may be omitted from the display panel DP, and thus the intermediate layer MDL may come in contact with a bottom surface of the base layer BL disposed in a lowermost portion of the display layer EL of the display panel DP.

The circuit board MPCB may be electrically connected to the display panel DP. As the display panel DP is bent, the circuit board MPCB may be disposed below the display panel DP.

The circuit board MPCB may be attached to a bottom surface of the cover layer CVP disposed on the lower portion of the display panel DP by an adhesive layer ADL. The adhesive layer ADL may include a typical adhesive or a typical detachable adhesive. For example, the adhesive layer ADL may be a pressure sensitive adhesive. For example, the adhesive layer ADL may include an acrylate-based compound or a silicone-based compound.

The electronic module EM may be electrically connected to the circuit board MPCB. For example, a connector CNT may be disposed on the circuit board MPCB, and the connector CNT and the electronic module EM may be connected to each other by a module circuit board CPCB. The electronic module EM may be electrically connected to the circuit board MPCB by the connector CNT and the module circuit board CPCB. Alternatively, the connector CNT and the module circuit board CPCB may be omitted, and a module circuit board may be embedded in the electronic module EM, and thus the electronic module EM and the circuit board MPCB may be electrically connected to each other by the intermediate layer MDL.

FIG. 8A to FIG. 8D are each an enlarged cross-sectional view illustrating a portion of an electronic device according to an embodiment of the inventive concept. FIG. 8A to FIG. 8D are each an enlarged view of an area AA of FIG. 7. Hereinafter, when a description is given about the electronic device EA according to an embodiment of the inventive concept with reference to FIG. 8A to FIG. 8D, a component previously described is denoted by the same reference numeral, and a detailed description thereof will not be given.

Figure 8A:
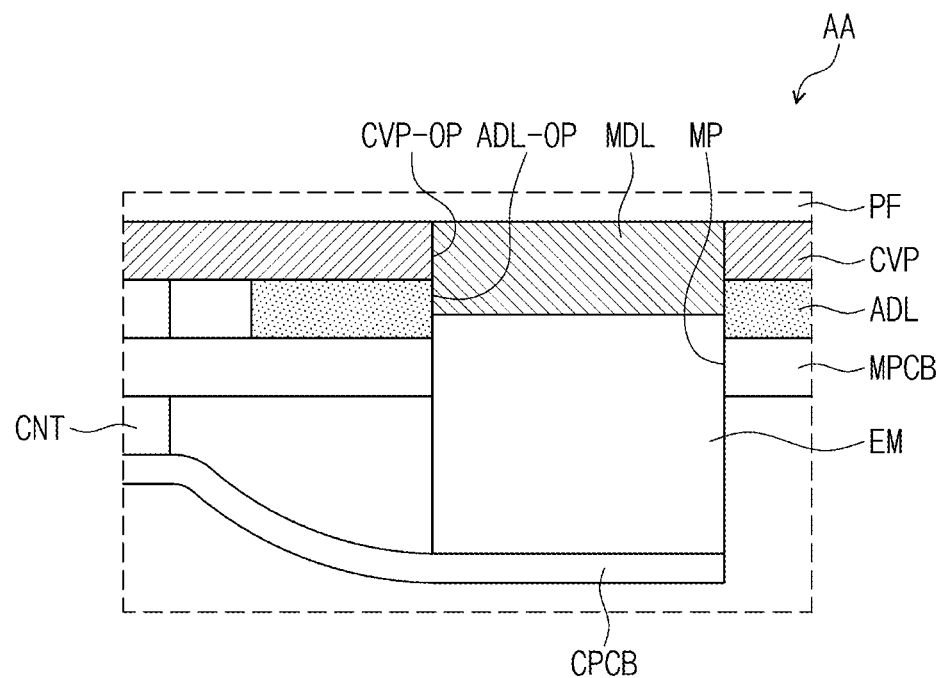
FIGS. 8A, 8B, 8C, and 8D are each an enlarged cross-sectional view illustrating a portion of an electronic device according to an embodiment of the inventive concept.

Referring to FIG. 7 and FIG. 8A, a cover opening CVP-OP may be disposed in the cover layer CVP, and the intermediate layer MDL may be disposed in the cover opening CVP-OP. As the cover opening CVP-OP is disposed in the cover layer CVP, and the intermediate layer MDL is disposed in the cover opening CVP-OP, the intermediate layer MDL may contact the protective layer PF that is the lowermost component of the display panel DP. Although FIG. 8A exemplarily illustrates the intermediate layer MDL as having a thickness larger than a thickness of the cover layer CVP, the thickness of the intermediate layer MDL is not limited thereto and may be smaller than or equal to the thickness of the cover layer CVP. When the thickness of the intermediate layer MDL is smaller than the thickness of the cover layer CVP, a portion of the electronic module EM may also be disposed in the cover opening CVP-OP. The cover opening CVP-OP may overlap the sensing area SA of the electronic device EA.

In correspondence with the cover opening CVP-OP, an adhesive opening ADL-OP may be included in the adhesive layer ADL that attaches the circuit board MPCB to the display panel DP. The adhesive opening ADL-OP may overlap the cover opening CVP-OP when viewed in a plane. The adhesive opening ADL-OP may be defined to overlap the sensing area SA of the electronic device EA. A portion among the intermediate layer MDL and the electronic module EM may be disposed in the adhesive opening ADL-OP.

The intermediate layer MDL may include an adhesive material. That is, the intermediate layer MDL may be an adhesive layer that attaches the electronic module EM to the display panel DP. The intermediate layer MDL may include an optically clear resin (OCR) or an optically clear adhesive (OCA). As the intermediate layer MDL includes an optically transparent adhesive material, a high transmittance may be secured in the sensing area SA in which the electronic module EM is disposed.

The circuit board MPCB includes the mounting part on which the electronic module EM is mounted. In an embodiment, the board opening MP may be included in the circuit board MPCB, and the electronic module EM may be disposed in the board opening MP. Accordingly, the circuit board MPCB and the electronic module EM may be non-overlapping when viewed in a plane. The electronic module EM may be disposed in the board opening MP to be electrically connected to the circuit board MPCB. The connector CNT may be disposed on the circuit board MPCB, and the connector CNT and the electronic module EM may be connected to each other by the module circuit board CPCB. The electronic module EM may be electrically connected to the circuit board MPCB by the connector CNT and the module circuit board CPCB.

In the electronic device according to an embodiment of the inventive concept, the electronic module is disposed in the mounting part disposed in the circuit board, is electrically connected to the circuit board, is non-overlapping with the circuit board, and is attached to the lower portion of the display panel by the intermediate layer. Accordingly, a structure such as a separate space and a frame configured to mount the electronic module is not desired in the housing or the like of the electronic device, so that the electronic device may be made thinner. In addition, because the electronic module is attached to the lower portion of the display panel by the optically transparent intermediate layer, external light is prevented from being introduced or scattered by a member configured to fix the electronic module to the display panel, thereby preventing performance of the electronic module from being degraded.

Figure 8B:
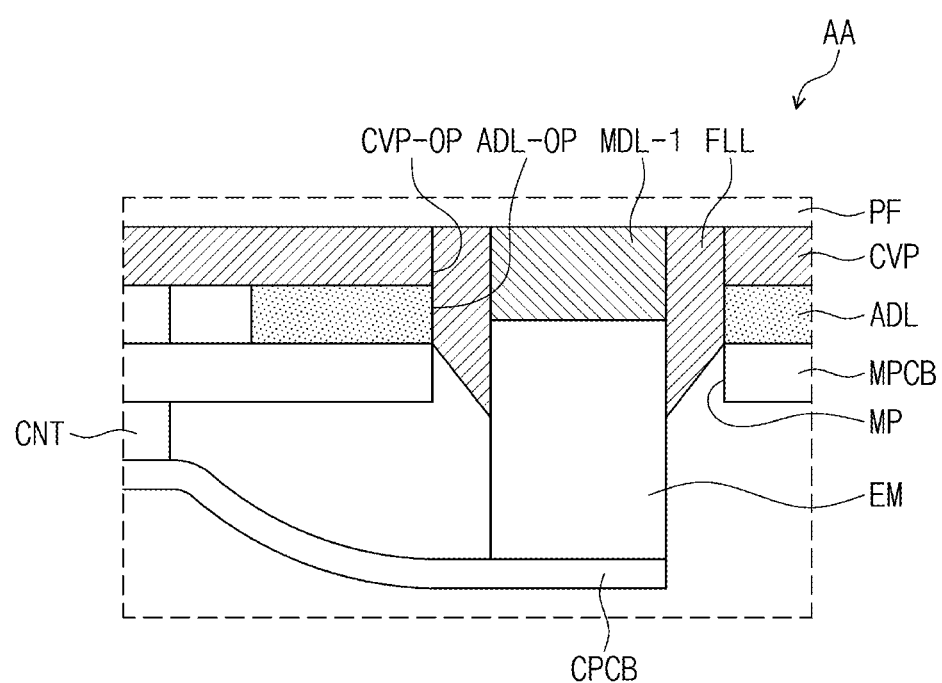

Referring to FIG. 7 and FIG. 8B, in the electronic device EA according to an embodiment, an intermediate layer MDL-1 may be disposed between a display panel DP and an electronic module EM, and the electronic device EA may further include a filler layer FLL that comes in contact with at least a portion among a side surface of the intermediate layer MDL-1 and a side surface of the electronic module EM. As illustrated in FIG. 8B, the filler layer FLL may be disposed in at least some of a cover opening CVP-OP, an adhesive opening ADL-OP, and a board opening MP.

The intermediate layer MDL-1 may include an optically clear adhesive material. The intermediate layer MDL-1 may include an optically clear resin or an optically clear adhesive.

The filler layer FLL may include an adhesive material. The filler layer FLL may include an adhesive material in which a light shielding material is dispersed. The filler layer FLL may include an optically clear resin or an optically clear adhesive, and a light shielding material may be dispersed in the optically clear resin or the optically clear adhesive. For example, the filler layer FLL may include a black dye or a black pigment such as carbon black. In the electronic device EA according to an embodiment, because the filler layer FLL is disposed in contact with the at least a portion among the side surface of the intermediate layer MDL-1 and the side surface of the electronic module EM and includes the light shielding material, light leakage to the side surface of the electronic module EM may be prevented. Accordingly, performance of the electronic module may be improved.

Figure 8C:
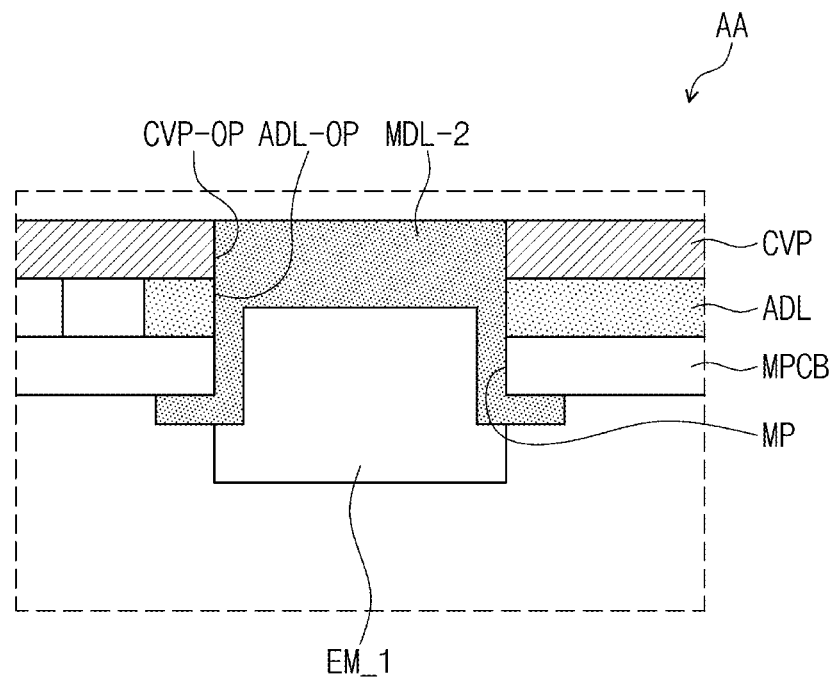

Referring to FIG. 7 and FIG. 8C, in the electronic device EA according to an embodiment, the connector CNT and the module circuit board CPCB may be omitted, a module circuit board may be embedded in an electronic module EM_1, and the electronic module EM_1 and a circuit board MPCB may be electrically connected to each other by an intermediate layer MDL-2.

The intermediate layer MDL-2 may be disposed between the electronic module EM_1 and a display panel DP and may include a metal. The intermediate layer MDL-2 may also be disposed on a portion among a side surface of the electronic module EM_1 and a bottom surface of the circuit board MPCB. The intermediate layer MDL-2 may be disposed in at least some of a cover opening CVP-OP, an adhesive opening ADL-OP, and a board opening MP.

The intermediate layer MDL-2 may include a metal, e.g., solder configured to electrically connect the electronic module EM_1 to the circuit board MPCB. The intermediate layer MDL-2 may be interposed between the electronic module EM_1 and the display panel DP and, through a soldering process, may bond the electronic module EM_1 to the display panel DP and, at the same time, may electrically connect the electronic module EM_1 to the circuit board MPCB.

Figure 8D:
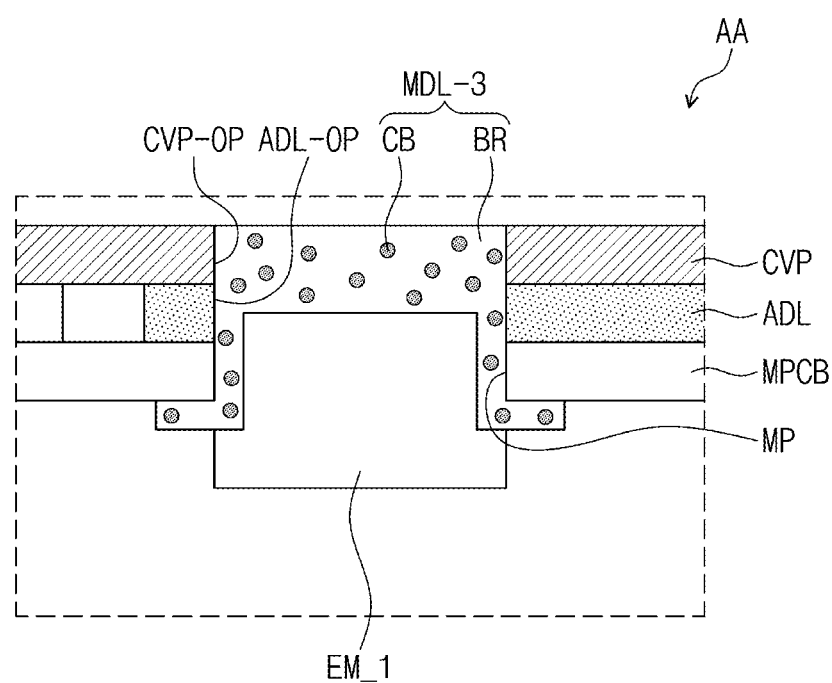

Referring to FIG. 7 and FIG. 8D, in the electronic device according to an embodiment, the connector CNT and the module circuit board CPCB may be omitted, a module circuit board may be embedded in an electronic module EM_1, and the electronic module EM_1 and a circuit board MPCB may be electrically connected to each other by an intermediate layer MDL-3.

The intermediate layer MDL-3 may be disposed between the electronic module EM_1 and a display panel DP and may include a conductive adhesive member. The intermediate layer MDL-3 may also be disposed on a portion among a side surface of the electronic module EM_1 and a bottom surface of the circuit board MPCB. The intermediate layer MDL-3 may be disposed in at least some of a cover opening CVP-OP, an adhesive opening ADL-OP, and a board opening MP.

The intermediate layer MDL-3 may include a conductive adhesive member, that is, an anisotropic conductive film (ACF). The intermediate layer MDL-3 may include base resin BR and conductive particles CB dispersed in the base resin BR. The electronic module EM_1 and the circuit board MPCB may be electrically connected to each other by the conductive particles CB included in the intermediate layer MDL-3. The intermediate layer MDL-3, which is the conductive adhesive member, may be interposed between the electronic module EM_1 and the display panel DP and may bond the electronic module EM_1 to the display panel DP and, at the same time, may electrically connect the electronic module EM_1 to the circuit board MPCB through the dispersed conductive particles CB.

Figure 9:
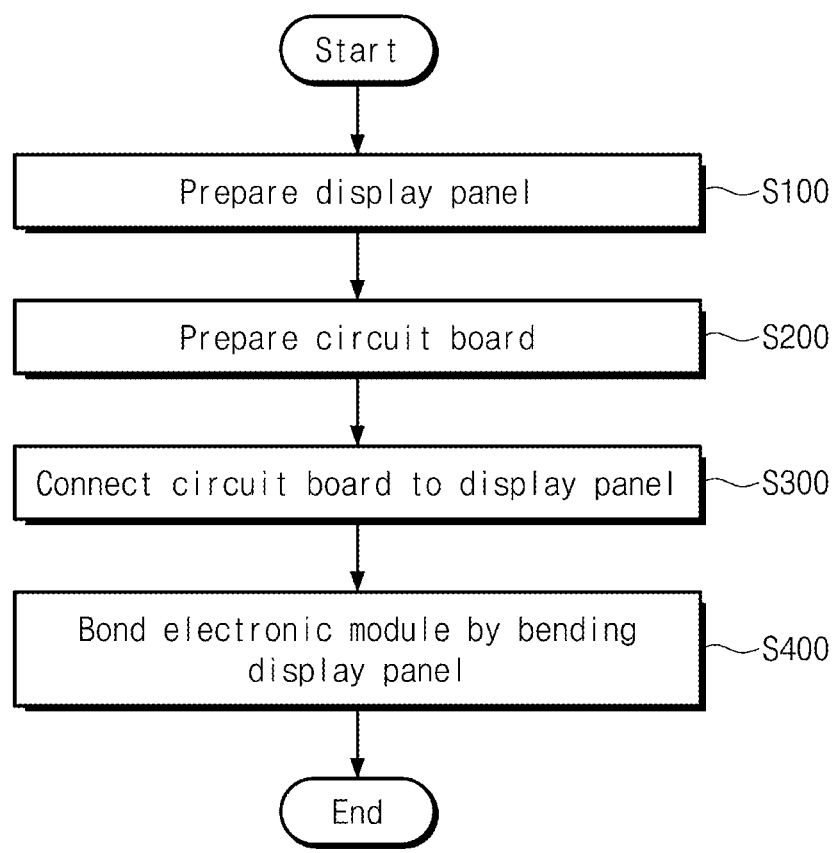
FIG. 9 is a flowchart illustrating a method of manufacturing an electronic device according to an embodiment of the inventive concept.
Figure 10A:
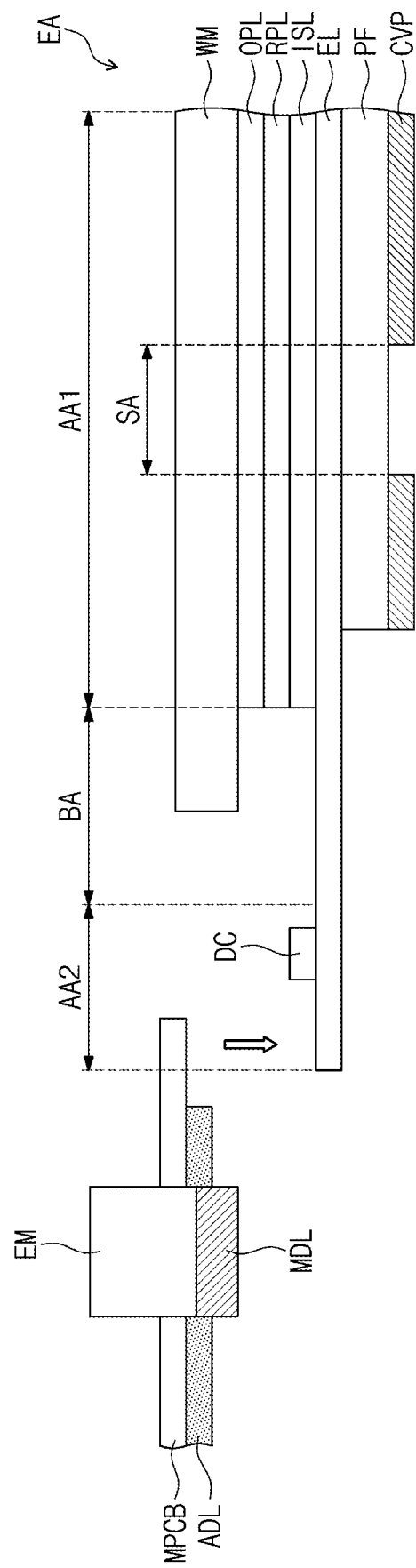
FIGS. 10A, 10B, and 10C are each a cross-sectional view illustrating some operations of a method of manufacturing an electronic device according to an embodiment of the inventive concept.
Figure 10B:
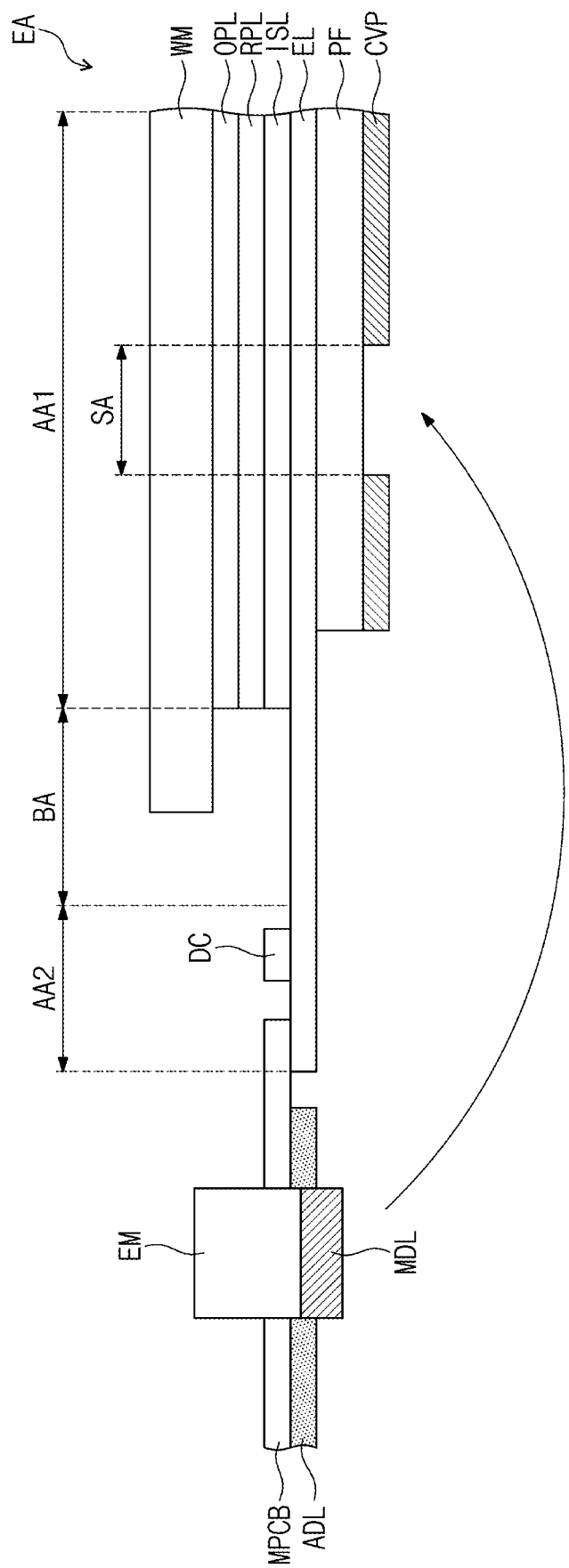
Figure 10C:
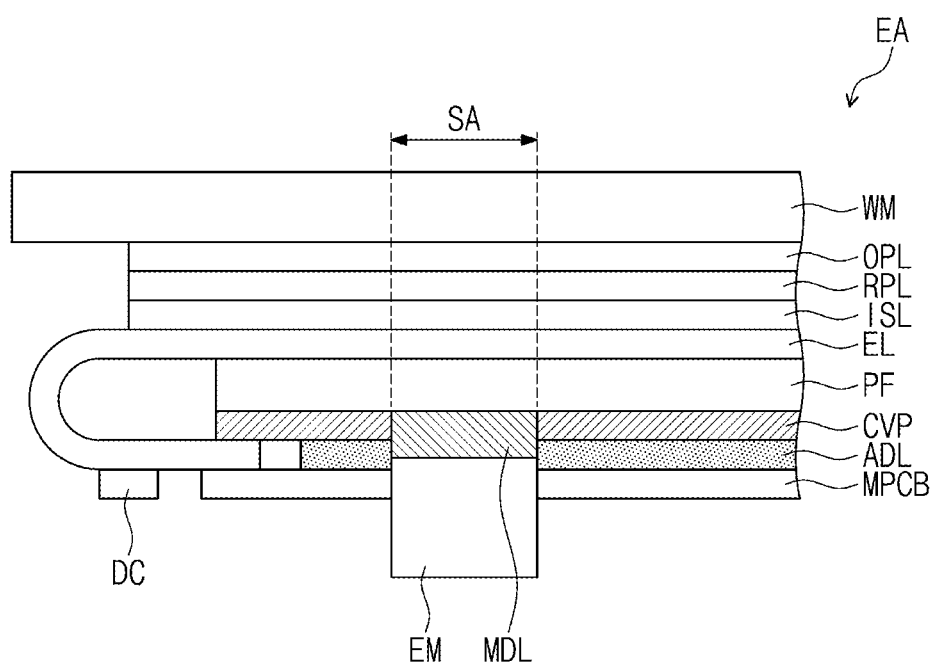

FIG. 9 is a flowchart illustrating a method of manufacturing an electronic device according to an embodiment of the inventive concept. FIG. 10A to FIG. 10C are each a cross-sectional view illustrating some operations of a method of manufacturing an electronic device according to an embodiment of the inventive concept. FIG. 10A to FIG. 10C sequentially illustrate operations of a method of manufacturing an electronic device in a cross section corresponding to the illustration of FIG. 7.

Referring to FIG. 9, the method of manufacturing an electronic device according to an embodiment of the inventive concept includes preparing a display panel in which a display area is defined that includes a first display area and a second display area having a higher transmittance than the first display area (S100), preparing a circuit board on which an electronic module is mounted (S200), connecting one end of the circuit board to the display panel (S300), and bonding the electronic module to a lower portion of the display panel by bending the display panel (S400).

Referring to figures such as FIG. 1A and FIG. 9 and FIG. 10A together, the method of manufacturing an electronic device according to an embodiment includes preparing a display panel DP in which a display area DP-DA and a peripheral area DP-NDA adjacent to the display area DP-DA are defined (S100). The display area DP-DA includes a first display area and a second display area. Transmittance of a sensing area DP-SA of the display area DP-DA may be higher than transmittance of the other portion of the display area DP-DA around the sensing area DP-SA, and the sensing area DP-SA of the display area DP-DA may be referred to as the second display area, and the other portion of the display area DP-DA around the sensing area DP-SA may be referred to as the first display area.

The method of manufacturing an electronic device according to an embodiment includes preparing a circuit board MPCB on which an electronic module EM is mounted (S200). The electronic module EM may be mounted on a mounting part of the circuit board MPCB to be electrically connected to the circuit board MPCB. A board opening MP (see FIG. 8A) may be disposed in the circuit board MPCB, and the electronic module EM may be disposed in the board opening MP of the circuit board MPCB. Although not illustrated, a connector CNT (see FIG. 7) and a module circuit board CPCB (see FIG. 7) may be disposed on the circuit board MPCB so that the electronic module EM is electrically connected to the circuit board MPCB. The electronic module EM mounted on the mounting part of the circuit board MPCB may be electrically connected to the circuit board MPCB by the connector CNT and the module circuit board CPCB. As in the embodiments illustrated in FIG. 8C and FIG. 8D, although not illustrated, the connector CNT and the module circuit board CPCB connecting the electronic module EM and the circuit board MPCB may be omitted, a module circuit board may be embedded in the electronic module EM, and the electronic module EM may be electrically connected to the circuit board MPCB by an intermediate layer MDL including a metal or a conductive adhesive member.

Referring to FIG. 9, FIG. 10A, and FIG. 10B, the method of manufacturing an electronic device according to an embodiment includes connecting one end of the circuit board MPCB to the display panel DP (S300). The circuit board MPCB may be electrically connected to pads PD (see FIG. 2B) disposed at one end of the display panel DP. Although not illustrated, an anisotropic conductive adhesive layer may electrically connect the circuit board MPCB to the pads PD.

Referring to FIG. 9, FIG. 10B, and FIG. 10C together, the method of manufacturing an electronic device according to an embodiment includes bonding the electronic module EM to a lower portion of the display panel DP by bending the display panel DP (S400).

Because at least a portion of the display panel DP is bent, two areas of the display panel DP that are not bent may be disposed on different planes. More specifically, as a bendable area BA of the display panel DP is bent, a second area AA2 and a first area AA1 may be disposed on different planes. As the bendable area BA of the display panel DP is bent, the circuit board MPCB connected to the second area AA2 and the electronic module EM mounted on the circuit board MPCB may be disposed below the display panel DP.

The electronic module EM is bonded to the lower portion of the display panel DP by the intermediate layer MDL. The electronic module EM may be bonded to a component, e.g., a protective layer PF disposed in a lowermost portion of the display panel DP with the intermediate layer MDL interposed therebetween. The intermediate layer MDL may come in contact with the protective layer PF and the electronic module EM.

When the electronic module EM is bonded to the lower portion of the display panel DP, the electronic module EM may come in contact with a bottom surface of the display panel DP without overlapping, when viewed in a plane, a cover layer CVP disposed on the lower portion of the display panel DP. A cover opening CVP-OP (see FIG. 8A) may be disposed in the cover layer CVP, and the intermediate layer MDL may be disposed in the cover opening CVP-OP.

When the electronic module EM is bonded to the lower portion of the display panel DP, the circuit board MPCB may be attached to a lower portion of the cover layer CVP. An adhesive layer ADL may be interposed between the circuit board MPCB and the cover layer CVP and may attach the circuit board MPCB to the cover layer CVP.

The intermediate layer MDL interposed between the electronic module EM and the display panel DP may be an adhesive material layer. For example, the intermediate layer MDL as the adhesive material layer may include an optically clear resin (OCR) or an optically clear adhesive (OCA). After an uncured optically clear resin or an uncured optically clear adhesive is provided to a lower portion of the electronic module EM, the display panel DP is bent to dispose the electronic module EM below the display panel DP, and then a bonding process of the electronic module EM may be performed by curing the optically clear resin or the optically clear adhesive in contact with the lower portion of the display panel DP. The curing of the optically clear resin or the optically clear adhesive may include a pre-curing operation of curing at lower pressure and temperature and a main curing operation of curing at higher pressure and temperature. Although not illustrated, the method of manufacturing an electronic device may further include, after the curing of the optically clear resin or the optically clear adhesive, forming a filler layer FLL (see FIG. 8B) by curing a filler material after the filler material, which comes in contact with at least a portion among a side surface of the intermediate layer MDL and a side surface of the electronic module EM, is provided. The filler material may include an adhesive material such as an optically clear resin and an optically clear adhesive and a light shielding material such as a black dye and a black pigment.

The intermediate layer MDL interposed between the electronic module EM and the display panel DP may be a conductive adhesive material layer. For example, the intermediate layer MDL may be an anisotropic conductive film (ACF). The intermediate layer MDL may include base resin and conductive particles dispersed in the base resin.

The intermediate layer MDL interposed between the electronic module EM and the display panel DP may be a layer including a metallic material. For example, the intermediate layer MDL may include solder. The intermediate layer MDL may be interposed between the electronic module EM and the display panel DP and, through a soldering process, may bond the electronic module EM to the display panel DP and, at the same time, may electrically connect the electronic module EM to the circuit board MPCB.

In the method of manufacturing an electronic device according to an embodiment, after the electronic module is mounted on the circuit board, the display panel may be bent to attach the electronic module to a bottom surface of the display panel. Accordingly, because the electronic module may be disposed to overlap the sensing area in the bending of the display panel, separately arranging the electronic module is not desired and thus, a manufacturing process of the electronic device may be simplified. Accordingly, the cost and time of the manufacturing process of the electronic device may be reduced.

According to an embodiment of the inventive concept, a module such as a sensor and a camera is attached to the lower portion of the display panel while mounted on the circuit board, so that the electronic device may be made thinner, and the performance of the module such as the sensor and the camera may be improved. In addition, because the module may be disposed in an area having a high transmittance in a bending process of the display panel, the manufacturing process may be simplified and the cost and time of the process may be reduced.

Although the exemplary embodiments of the inventive concept have been described herein, it is understood that various changes and modifications can be made by those skilled in the art within the spirit and scope of the inventive concept defined by the following claims or the equivalents. Therefore, the exemplary embodiments described herein are not intended to limit the technical spirit and scope of the present invention, and all technical spirit within the scope of the following claims or the equivalents will be construed as being included in the scope of the present invention.

What is claimed is:

1. An electronic device comprising:
    a display panel including a first display area and a second display area having a higher transmittance than the first display area;
    a cover layer disposed on a lower portion of the display panel;
    an electronic module disposed below the cover layer and second display area of the display panel;
    a circuit board connected to the display panel and on which the electronic module is mounted; and
    an intermediate layer disposed between the electronic module and the display panel,
    wherein a cover opening overlapping the electronic module is included in the cover layer and the intermediate layer is disposed in at least a center region of the cover opening,
    wherein the electronic module and the circuit board do not overlap each other when viewed in a plane.

2. The electronic device of claim 1, wherein the electronic module is electrically connected to the circuit board.

3. The electronic device of claim 2, further comprising:
    a connector disposed on the circuit board; and
    a module circuit board configured to connect the connector and the electronic module.

4. The electronic device of claim 3, wherein the intermediate layer is an adhesive layer that attaches the electronic module to the display panel,
    wherein the intermediate layer includes an optically clear resin (OCR) or an optically clear adhesive (OCA).

5. The electronic device of claim 1, further comprising:
    a filler layer in contact with at least a portion among a side surface of the intermediate layer and a side surface of the electronic module.

6. The electronic device of claim 1, wherein the intermediate layer comprises:
    a metal.

7. The electronic device of claim 1, wherein the intermediate layer comprises:
    an anisotropic conductive film (ACF) including conductive particles.

8. The electronic device of claim 1, wherein a board opening is included in the circuit board, and the electronic module is disposed in the board opening.

9. The electronic device of claim 1, wherein the electronic module is in contact with a bottom surface of the intermediate layer, and the intermediate layer is in contact with a bottom surface of the display panel.

10. The electronic device of claim 1, wherein the display panel comprises:
    a plurality of pixels arranged in the first display area and the second display area,
    wherein the plurality of pixels comprise:
    a plurality of first pixels arranged in the first display area; and
    a plurality of second pixels arranged in the second display area,
    wherein the number of the plurality of first pixels arranged per unit surface area is larger than the number of the plurality of second pixels arranged per the unit surface area.

11. The electronic device of claim 1, wherein the display panel comprises:
    a first non-bendable portion in which the first display area and the second display area are included, a bendable portion that extends from the first non-bendable portion and is bent to have a predetermined curvature, and a second non-bendable portion extending from the bendable portion and facing the first non-bendable portion,
    wherein the circuit board is connected to the second non-bendable portion.

12. An electronic device comprising:
    a display panel having a first display area and a second display area having a higher transmittance than the first display area;
    an electronic module disposed below the second display area of the display panel;
    a circuit board connected to the display panel and electrically connected to the electronic module; and
    an intermediate layer disposed between the electronic module and the display panel,
    wherein a board opening is included in the circuit board, and the electronic module is disposed in the board opening, and
    the intermediate layer comes in contact with a bottom surface of the display panel,
    wherein the intermediate layer comprises an anisotropic conductive film (ACF) including conductive particles or a metal.

13. The electronic device of claim 12, further comprising:
    a cover layer which is disposed on a lower portion of the display panel and in which a cover opening is included,
    wherein the electronic module is disposed to overlap the cover opening.

* * * * *